(12) United States Patent
Sato et al.

(10) Patent No.: US 6,972,619 B2
(45) Date of Patent: Dec. 6, 2005

(54) AMPLIFIER WITH A GAIN PROPORTIONAL TO POWER SOURCE VOLTAGE

(75) Inventors: Masaharu Sato, Otsu (JP); Takuma Ishida, Takatsuki (JP); Taku Kobayashi, Suita (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 58 days.

(21) Appl. No.: 10/734,369

(22) Filed: Dec. 12, 2003

(65) Prior Publication Data

US 2004/0124923 A1      Jul. 1, 2004

(30) Foreign Application Priority Data

Dec. 17, 2002    (JP)    ............................. 2002-364865

(51) Int. Cl.[7] ............................................. H03F 1/36
(52) U.S. Cl. ...................... 330/86; 330/174; 73/504.16
(58) Field of Search ........................ 73/504.02, 504.16; 330/86, 174, 285

(56) References Cited

U.S. PATENT DOCUMENTS

| 5,014,554 A | 5/1991 | Terada et al. ................. 73/505 |
| 5,038,613 A | 8/1991 | Takenaka et al. ............. 73/505 |
| 5,212,985 A | 5/1993 | Takenaka et al. ............. 73/505 |
| 5,239,868 A | 8/1993 | Takenaka et al. ............. 73/505 |
| 5,447,066 A | 9/1995 | Terada et al. ............. 73/504.16 |
| 5,581,032 A | 12/1996 | Uemura et al. ................. 73/493 |
| 5,939,630 A * | 8/1999 | Nozoe et al. ............. 73/504.16 |
| 6,220,094 B1 | 4/2001 | Ichinose et al. ......... 73/504.16 |
| 6,412,347 B1 | 7/2002 | Kuroda et al. ........... 73/504.16 |

FOREIGN PATENT DOCUMENTS

| JP | HEI 3-103768 | 4/1991 |
| JP | HEI 6-208424 | 7/1994 |

* cited by examiner

*Primary Examiner*—Steven J. Mottola
(74) *Attorney, Agent, or Firm*—Sheridan Ross P.C.

(57) ABSTRACT

In order that an amplifier with a gain proportional to source voltage is obtained, the drain-source voltages of first and second P-channel MOS-FETs are zero-biased, and a voltage shifted higher by the amount of the threshold voltage of the P-channel MOS-FET on the basis of a voltage obtained by dividing the power source voltage by resistors is applied to the positive input terminal of an operational amplifier. The gate of one of the first and second MOS-FETs is connected to a circuit ground, and a negative fixed voltage with reference to the potential obtained by dividing the power source voltage by resistors is applied to the gate of the other MOS-FET. The ON resistances of the two MOS-FETs are used as the input resistor and the feedback resistor of the operational amplifier, respectively.

6 Claims, 14 Drawing Sheets

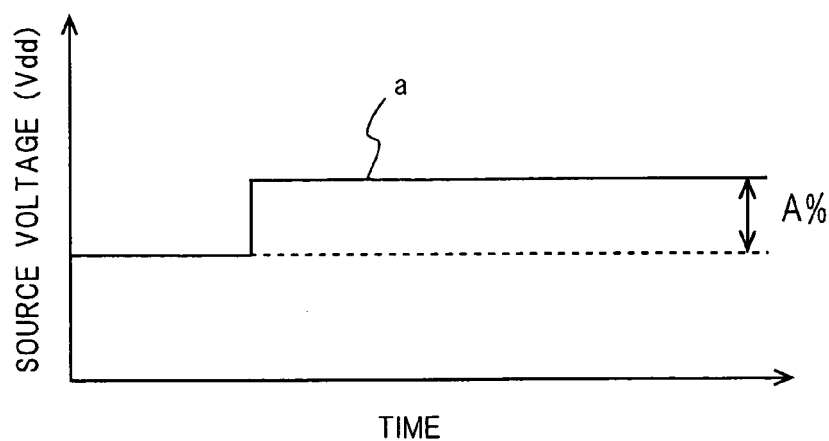
F I G. 1 1 ( a )
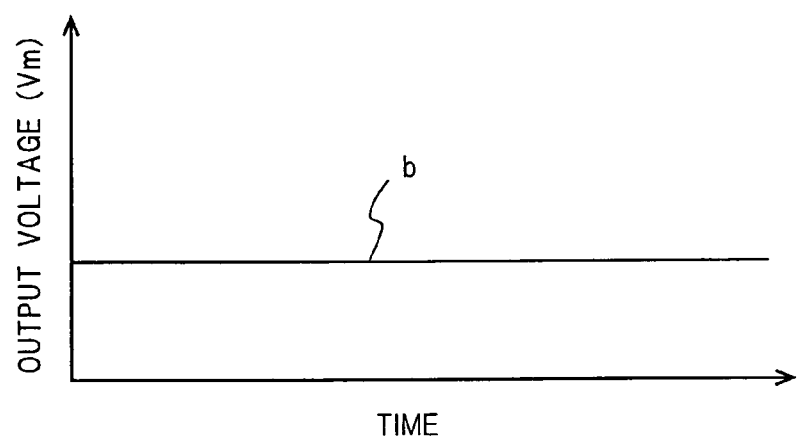
F I G. 1 1 ( b )
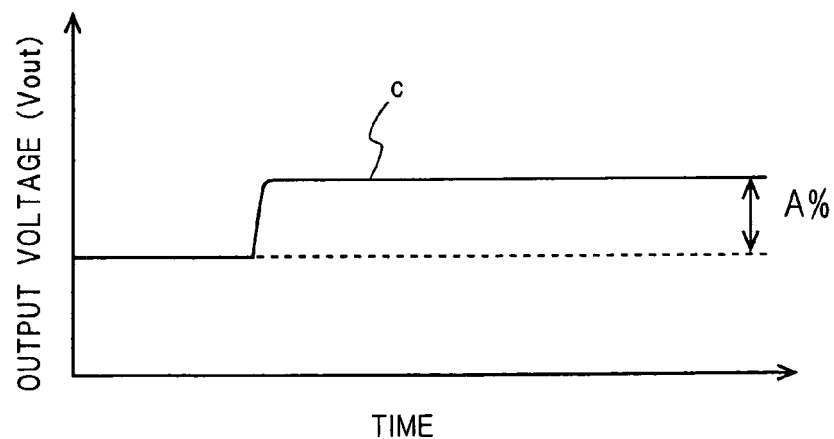
F I G. 1 1 ( c )

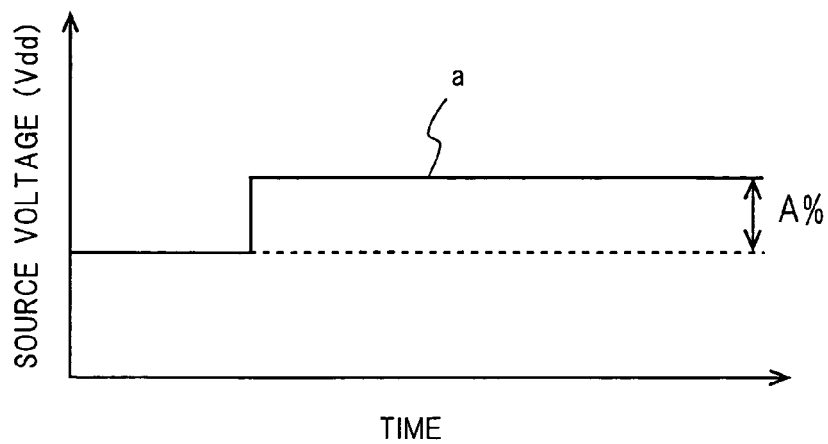
F I G. 1 4 ( a )
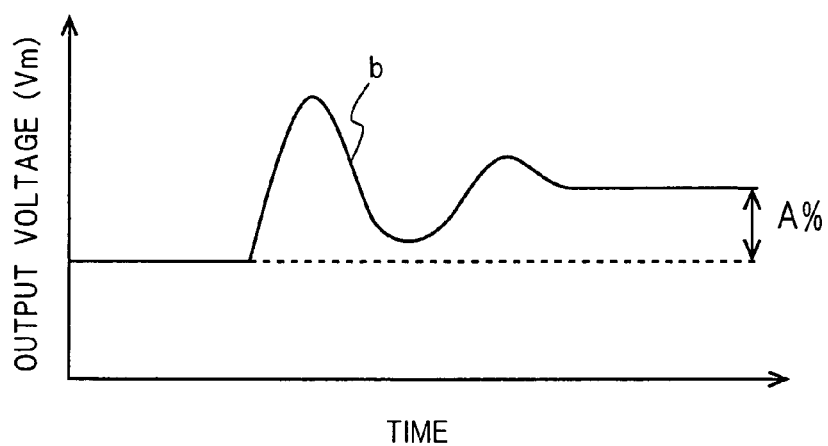
F I G. 1 4 ( b )
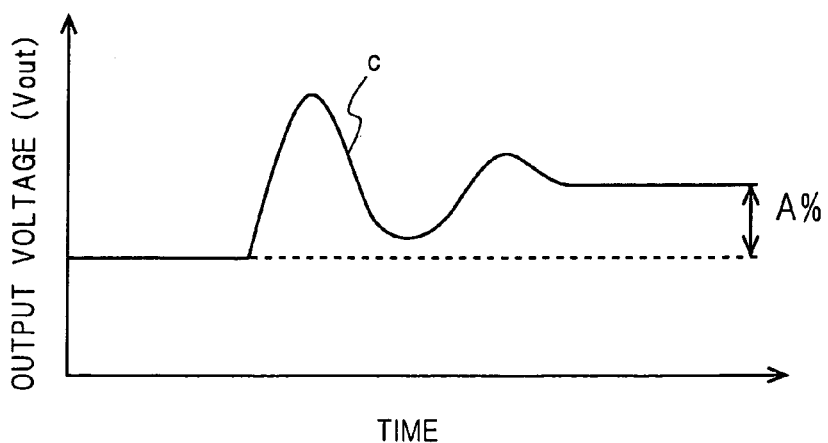
F I G. 1 4 ( c )

AMPLIFIER WITH A GAIN PROPORTIONAL TO POWER SOURCE VOLTAGE

BACKGROUND OF THE INVENTION

The present invention relates to an amplifier whose gain changes depending on the change of a power source voltage and more particularly to an angular velocity sensor apparatus incorporating this amplifier.

Although various amplifiers, such as DC amplifiers and high-frequency amplifiers, are used for electronic devices, it is general that the voltage of the DC power source of such an amplifier is stabilized and maintained constant. The amplifier can have stable characteristics by maintaining the voltage of the power source constant.

However, electronic devices mounted on mobile bodies, such as automobiles, and used in severe environmental conditions have a problem wherein the power source voltage having been stabilized once varies owing to load variation and external noise. In recent automobiles, many sensors are used for automobile body control and safety devices, such as an attitude control system and an antilock brake system (ABS). The output signals of the most of these sensors are analog signals. Such an analog signal is required to be converted into a digital signal by using an AD converter so that data processing is performed by using a microcomputer on the basis of the analog signal and predetermined judgments and control are carried out.

A reference voltage (VREF) is usually required in the case when AD conversion is carried out. The same reference voltage as VREF is also required on the side of a sensor outputting a signal to be AD converted. Hence, in the case when an AD converter is away from the sensor, a wire connected to a reference voltage source is required in addition to a power source wire, a grounding wire and a signal output transmission wire. However, the number of wires in electronic devices for automobiles and the like is required to be decreased in view of cost and reliability. Hence, it is general that no reference voltage source is provided and that the voltage of the DC power source is used as the reference voltage.

In this kind of electronic device, when the power source voltage rises while the detection output of the sensor is constant, the AD converter carries out AD conversion on the basis of the raised power source voltage. As a result, the digital output obtained after the AD conversion lowers as if the detection output of the sensor is decreased. Hence, if the AD conversion is carried out in this way, no correct detection data is obtainable. The correct detection data is obtainable by increasing the power source voltage by 10% for example, so that the detection output of the sensor is increased by 10%, and the increased detection output is then input to the AD converter. With this measure the variation of power source voltage is cancelled, whereby the converted digital output properly corresponds to the analog detection output of the sensor.

As described above, a sensor mounted on an automobile or the like is required to have a characteristic wherein its output varies in proportion to the power source voltage.

Since it was difficult to attain a highly accurate amplifier having this kind of characteristic in conventional electronic devices for automobiles and the like, the sensitivity itself of the sensor has been made proportional to the power source voltage.

As an example of conventional electronic devices for automobiles, an angular velocity sensor apparatus for detecting the rocking of an automobile body has been used to control the attitude of an automobile. The configuration and operation of a conventional angular velocity sensor apparatus will be described below referring to FIG. 12.

FIG. 12 is a system block diagram of a conventional angular velocity sensor apparatus.

Referring to FIG. 12, an angular velocity sensor 10 is a resonant sensor having a well-known tuning-fork structure disclosed in U.S. Pat. No. 5,014,554, U.S. Pat. No. 5,038,613, U.S. Pat. No. 5,239,868 and U.S. Pat. No. 5,447,066. The angular velocity sensor 10 has a tuning-fork structure wherein a vibration element is installed on each end of a connection plate 107 whose central portion is supported by a support post 100. A drive element 101 comprising the vibration element to which a piezoelectric element is bonded is installed at one end of the connection plate 107. The drive element 101 is a drive source for tuning-fork vibration. A detection element 103 for detecting a Coriolis force generated depending on an angular velocity is connected to the upper end of the drive element 101. A level detection element 102 comprising the vibration element to which a piezoelectric element is bonded is installed at the other end of the connection plate 107. The level detection element 102 is an element for detecting the vibration level, that is, amplitude, of the tuning-fork vibration. A detection element 104 for detecting a Coriolis force generated depending on an angular velocity is connected to the upper end of the level detection element 102.

A terminal 133 connected to the level detection element 102 of the angular velocity sensor 10 is connected to the input terminal of a first amplifier 111. An input signal Vin owing to the charge generated on the surface of the level detection element 102 is input to the first amplifier 111. The output voltage Vm of the first amplifier 111 is input to a rectifier 122, a variable gain amplifier 125 and a phase detector 127. The output voltage Vm is rectified by the rectifier 122, smoothened by a smoothing circuit 123 comprising a resistor 143 and a capacitor 144 and input to the negative input terminal of the adder 125a of the variable gain amplifier 125. The comparison voltage Vr of a comparison voltage generation circuit 114 is applied to the positive input terminal of the adder 125a. The comparison voltage generation circuit 114 comprises two resistors 141 and 142 having the same resistance value and connected in series. The resistors 141 and 142 connected in series are further connected between a power source VDD and a circuit ground Gr. Half of the power source voltage is output as the comparison voltage Vr. The adder 125a applies the voltage difference between the output voltage of the smoothing circuit 123 and the comparison voltage Vr to an amplifier 125b that is capable of changing its gain by virtue of voltage control in the variable gain amplifier 125. The gain of the amplifier 125b is controlled by the voltage difference between the two voltages input to the adder 125a. An output signal obtained by this control is applied from the drive terminal 130 of the angular velocity sensor 10 to the drive element 101 and drives this element.

Since the output of the first amplifier 111 is amplified by the variable gain amplifier 125 and applied from the terminal 130 of the angular velocity sensor 10 to the drive element 101, the loop circuit circuit including the first amplifier 111, the rectifier 122, the smoothing circuit 123, the variable gain amplifier 125 and the angular velocity sensor 10 forms a sinusoidal oscillation circuit having an automatic gain control function. This loop circuit circuit is hereafter referred to as an "AGC loop circuit circuit." The amplitude of the output voltage Vm of the first amplifier 111 is controlled so as to become constant by the AGC loop circuit circuit.

With the above-mentioned configuration, the angular velocity sensor 10 carries out tuning-fork vibration with a constant amplitude without being affected by variations in the characteristics of the elements and changes in temperature. In addition, the angular velocity sensor 10 attains high angular velocity detection sensitivity without being affected by variations in the characteristics of the elements and changes in temperature.

The comparison voltage Vr of the comparison voltage generation circuit 114 shown in FIG. 12 is the voltage at the connection point of the two resistors 141 and 142 connected in series between the power source VDD and the circuit ground Gr. Hence, the comparison voltage Vr varies depending on the variation of the voltage (power source voltage Vdd) of the power source VDD. The voltage variation rate (%) of the comparison voltage Vr is the same as that of the power source voltage Vdd with reference to the circuit ground Gr.

Hence, the amplitude of the output voltage Vm always becomes a sinusoidal voltage having an amplitude proportional to the power source voltage Vdd. When the first amplifier 111 and the rectifier 122 are configured so as not to depend on the power source voltage Vdd, the output signal of the level detection element 102 of the angular velocity sensor 10, that is, the input signal Vin of the first amplifier 111, also becomes a voltage proportional to the power source voltage Vdd as the output voltage Vm does. The level variation of the voltage of each of the detection elements 103 and 104 is proportional to the amplitude of the sinusoidal wave output from the level detection element 102. Hence, an angular velocity output signal, which is obtained when signal of the level variation is detected by the phase detector 127, amplified by a DC amplifier 118 and output to an output terminal 119, also becomes proportional to the power source voltage Vdd. As a result, it is possible to obtain an amplifier device whose gain changes in proportion to the power source voltage Vdd.

The operation of the amplifier device shown in FIG. 12 at the time when the power source voltage Vdd varies will be described referring to FIG. 13, FIG. 14a, FIG. 14b and FIG. 14c.

Since the angular velocity sensor 10 is an element generating mechanical vibration, it has a characteristic of functioning as a mechanical filter, a relatively larger time constant, and a relatively slow response speed. In addition, the smoothing circuit comprising the resistor 143 and the capacitor 144 is a low-pass filter having a large time constant. Hence, the response speed of the AGC loop circuit circuit including the angular velocity sensor 10, the amplifier 111, the rectifier 122, the smoothing circuit 123 and the variable gain amplifier 125 to disturbance is relatively low. In other words, its response frequency is relatively low. An example of the response characteristic is shown in the graph of FIG. 13.

In the graph of FIG. 13, the horizontal axis represents the variation of the power source voltage Vdd. In addition, "fr" is a resonance frequency determined by the delay of the response characteristic of the angular velocity sensor 10 and the time constant of the smoothing circuit 123, about 10 Hz, for example. The vertical axis represents the voltage variation ratio (dB) of the input voltage Vin. The voltage variation ratio Rvin/RVdd is represented by the ratio between the source voltage variation rate RVdd of the power source voltage Vdd and the input voltage variation rate RVin of the input voltage Vin of the amplifier 111, that is, RVin/RVdd. For example, if the input voltage Vin rises 10% when the power source voltage Vdd rises 10%, the voltage variation ratio RVin/RVdd is 0 dB. When the variation speed of the power source voltage Vdd is very low, that is, when the frequency of the variation is very low, that is, when the power source voltage Vdd is a DC voltage or close to a DC voltage, the AGC function described above operates effectively. As a result, the input voltage Vin varies in proportion to the power source voltage Vdd. Hence, the source voltage variation rate RVdd and the input voltage regulation rate RVin become the same value, whereby the voltage variation ratio become 0 dB. In the case when the variation speed of the power source voltage Vdd is high, that is, when the power source voltage Vdd varies at a high frequency "fh" (100 Hz, for example) to the extent that the above-mentioned AGC function cannot follow the variation, the input voltage variation rate RVin becomes smaller than the source voltage variation rate RVdd. Hence, the voltage variation ratio becomes less than 0 dB as shown in the graph of FIG. 13. However, the input voltage variation rate RVin may become twice or more the source voltage variation RVdd at the resonance frequency fr, whereby the ratio may form a sharp peak as shown in FIG. 13.

The response speed of the AGC loop circuit circuit is increased by raising the gain of the AGC loop circuit circuit. However, when the gain is raised, the variation ratio of the input voltage Vin with respect to the power source voltage Vdd increases, whereby the voltage variation ratio at the resonance frequency fr increases further.

In the conventional circuit shown in FIG. 12, in the case when the power source voltage Vdd rises by A % unit step as indicated by a waveform "a" in FIG. 14a, the output voltage Vm vibrates as indicated by a waveform "b" in FIG. 14b. If such an abrupt source voltage variation as shown in FIG. 14a occurs while the output voltage Vm having a constant value is output from the first amplifier 111, the output voltage Vout indicating an angular velocity output to the angular velocity signal output terminal 119 also varies as shown in FIG. 14c in a way similar to that shown in FIG. 14b. Therefore, the output voltage Vout cannot properly follow the variation of the power source voltage Vdd.

BRIEF SUMMARY OF THE INVENTION

The present invention is intended to provide an amplifier whose response speed is high and whose gain is proportional to a power source voltage such that even when the power source voltage varies abruptly, the gain changes so as to follow the variation of the power source voltage, and an output voltage depending on the variation of the power source voltage is obtained.

An amplifier in accordance with the present invention whose gain is proportional to a power source voltage comprises first and second P-channel MOS field-effect transistors (hereafter abbreviated to MOS-FETs) whose respective back gates are formed so as to be electrically isolated from a semiconductor substrate and whose respective sources are connected in common, a first voltage source for outputting a voltage obtained by dividing a power source voltage, a second voltage source for generating a positive voltage having a potential difference almost identical to the threshold voltages of the above-mentioned first and second MOS-FETs with reference to the output voltage of the above-mentioned first voltage source, a third voltage source for generating a predetermined negative voltage with reference to the output voltage of the above-mentioned first voltage source, and an operational amplifier, to the positive input terminal of which the output of the above-mentioned second voltage source is applied as a bias voltage. The sources of the above-mentioned first and second MOS-FETs, connected in common, are connected to the negative input terminal of the above-mentioned operational amplifier, and the respective back gates of the above-mentioned first and second MOS-FETs are connected to either their respective sources or the above-mentioned second voltage source. The gate of the above-mentioned first MOS-FET is biased at the potential of a circuit ground, and its drain is connected to an input terminal to which a signal with no DC component is input. The gate of the above-mentioned second MOS-FET is connected to the above-mentioned third voltage source, and its drain is connected to the output terminal of the above-mentioned operational amplifier, which leads to the output terminal of the above-mentioned amplifier.

In accordance with the present invention, the gain of the amplifier changes in proportion to a power source voltage. Therefore, when each of analog detection outputs of various sensors is amplified by using this amplifier, the amplified detection output changes depending on the change of the power source voltage. Hence, even when the power source voltage is used as a reference voltage when an analog detection output is AD converted, it is possible to obtain a digital output properly corresponding to the above-mentioned analog detection output. Since the frequency characteristic of the amplifier is sufficiently high (extending to a high frequency range), particularly when the amplifier is used for various sensors mounted on vehicles, the amplifier has a sufficient response speed, thereby being applicable to various high-speed operation sensors.

An amplifier in accordance with another aspect of the present invention whose gain is proportional to a power source voltage comprises first and second N-channel MOS-FETs whose respective back gates are formed so as to be electrically isolated from a semiconductor substrate and whose respective sources are connected in common, a first voltage source for outputting a voltage obtained by dividing a power source voltage, a second voltage source for generating a negative voltage having a potential difference almost identical to the threshold voltages of the above-mentioned first and second MOS-FETs with reference to the output voltage of the above-mentioned first voltage source, a third voltage source for generating a predetermined positive voltage with reference to the output voltage of the above-mentioned first voltage source, and an operational amplifier, to the positive input terminal of which the output of the above-mentioned second voltage source is applied as a bias voltage. The sources of the above-mentioned first and second MOS-FETs, connected in common, are connected to the negative input terminal of the above-mentioned operational amplifier. The respective back gates of the above-mentioned first and second MOS-FETs are connected to either their respective sources or the output terminal of the above-mentioned second voltage source, the gate of the above-mentioned first MOS-FET is connected to the above-mentioned positive power source voltage, and its drain is connected to an input terminal to which a signal with no DC component is input. The gate of the above-mentioned second MOS-FET is connected to the above-mentioned third voltage source, and its drain is connected to the output terminal of the above-mentioned operational amplifier, which leads to the output terminal of the above-mentioned amplifier.

In accordance with the present invention, the gain of the amplifier changes in proportion to a power source voltage. Therefore, when each of analog detection outputs of various sensors is amplified by using this amplifier, the amplified detection output changes depending on the change of the power source voltage. Hence, even when the power source voltage is used as a reference voltage when an analog detection output is AD converted, it is possible to obtain a digital output properly corresponding to the above-mentioned analog detection output. Since the frequency characteristic of the amplifier is sufficiently high, particularly when the amplifier is used for various sensors mounted on vehicles, the amplifier has a sufficient response speed, thereby being applicable to various high-speed operation sensors.

An amplifier in accordance with another aspect of the present invention whose gain is proportional to a power source voltage comprises first and second P-channel MOS-FETs whose respective back gates are formed so as to be electrically isolated from a semiconductor substrate and whose respective sources are connected in common, a first voltage source for outputting a voltage obtained by dividing a power source voltage, a second voltage source for generating a positive voltage having a potential difference almost identical to the threshold voltages of the above-mentioned first and second MOS-FETs with reference to the output voltage of the above-mentioned first voltage source, a third voltage source for generating a predetermined negative voltage with reference to the output voltage of the above-mentioned first voltage source, and first and second operational amplifiers whose respective positive input terminals are connected to the above-mentioned second voltage source. The sources of the above-mentioned first and second MOS-FETs, connected in common, are connected to the output terminal of the above-mentioned first operational amplifier, and the respective back gates of the above-mentioned first and second MOS-FETs are connected to either their respective sources or the above-mentioned second voltage source. The gate of the above-mentioned first MOS-FET is connected to the above-mentioned third voltage source, and its drain is connected to the negative input terminal of the above-mentioned first operational amplifier and to an input terminal to which a signal with no DC component is input. The gate of the above-mentioned second MOS-FET is connected to a circuit ground, and its drain is connected to the negative input terminal of the above-mentioned second operational amplifier. A resistor is connected between the negative input terminal of the above-mentioned second operational amplifier and the output terminal of the above-mentioned second operational amplifier, which leads to the output terminal of the above-mentioned amplifier.

In accordance with the present invention, the gain of the amplifier changes in proportion to a power source voltage. Therefore, when each of analog detection outputs of various sensors is amplified by using this amplifier, the amplified detection output changes depending on the change of the power source voltage. Hence, even if the power source voltage is used as a reference voltage when an analog detection output is AD converted, it is possible to obtain a digital output properly corresponding to the above-mentioned analog detection output. In the case when an input signal is a current signal, the first operational amplifier and the first MOS-FET serving as its feedback resistor operate as a current-voltage converter. In addition, the second operational amplifier, the second MOS-FET and the resistor form an ordinary inverting amplifier. Hence, the gain between the input terminal and the output terminal is the product of the gain of the current-voltage converter and the gain of inverting amplifier, allowing to obtain a large gain.

An amplifier in accordance with another aspect of the present invention whose gain is proportional to a power source voltage comprises first and second P-channel MOS- FETs whose respective back gates are formed so as to be electrically isolated from a semiconductor substrate and whose respective sources are connected in common, third and fourth P-channel MOS-FETs whose respective sources are connected in common, a first voltage source for outputting a voltage obtained by dividing a power source voltage, a second voltage source for generating a positive voltage having a potential difference almost identical to the threshold voltages of the above-mentioned first, second, third and fourth MOS-FETs with reference to the output voltage of the above-mentioned first voltage source, a third voltage source for generating a predetermined negative voltage with reference to the output voltage of the above-mentioned first voltage source, first and second operational amplifiers whose positive input terminals are connected in common and biased by the above-mentioned second voltage source, the first and second P-channel MOS-FETs whose respective sources are connected in common and further connected to the output terminal of the above-mentioned first operational amplifier, and the third and fourth P-channel MOS-FETs whose respective sources are connected in common and further connected to the output terminal of the above-mentioned second operational amplifier. The respective back gates of the above-mentioned first, second, third and fourth MOS-FETs are connected to either their respective sources or the above-mentioned second voltage source, and the gates of the above-mentioned first and third MOS-FETs are connected to the above-mentioned third voltage source. The drain of the above-mentioned first MOS-FET is connected to the negative input terminal of the above-mentioned first operational amplifier and to a first input terminal to which a signal with no DC component is input. The drain of the above-mentioned third MOS-FET is connected to the negative input terminal of the above-mentioned second operational amplifier and to a second input terminal to which a signal with no DC component is input. The gates of the above-mentioned second and fourth MOS-FETs are connected to a circuit ground, and the drain of the above-mentioned second MOS-FET is connected to the positive input terminal of the above-mentioned third operational amplifier. The drain of the above-mentioned fourth MOS-FET is connected to the negative input terminal of the above-mentioned third operational amplifier, the above-mentioned second voltage source is connected to the positive input terminal of the above-mentioned third operational amplifier via a first resistor, and a second resistor is connected between the negative input terminal of the above-mentioned third operational amplifier and the output terminal of the above-mentioned third operational amplifier, which leads to the output terminal of the above-mentioned amplifier.

In accordance with the present invention, the gain of the amplifier changes in proportion to a power source voltage. When each of analog detection outputs of various sensors is amplified by using this amplifier, the amplified detection output changes depending on the change of the power source voltage. Hence, even if the power source voltage is used as a reference voltage when an analog detection output is AD converted, it is possible to obtain a digital output properly corresponding to the above-mentioned analog detection output. Since the frequency characteristic of the amplifier is sufficiently high, particularly when the amplifier is used for various sensors mounted on vehicles, the amplifier has a sufficient response speed, thereby being applicable to various high-speed operation sensors. Further, the amplifier has two input terminals of a first input terminal and a second input terminal, thereby being applicable also to sensors having two output terminals such as angular velocity sensors.

An angular velocity sensor apparatus in accordance with the present invention comprises a drive section for vibrating vibration elements, a vibration level detection section for detecting the vibration levels of the above-mentioned vibration elements, Coriolis force detection sections for detecting a Coriolis force generating depending on an angular velocity, a first amplifier for amplifying the output signal of the above-mentioned vibration level detection section, a rectifying circuit for rectifying the output signal of the above-mentioned first amplifier to obtain a DC voltage, a variable gain amplifier, receiving the output signal of the above-mentioned first amplifier, for changing its amplification degree depending on the output value of the above-mentioned rectifying circuit, a second amplifier for amplifying the output signals of the above-mentioned Coriolis force detection sections, a phase detector for detecting the phase of the output voltage of the above-mentioned second amplifier on the basis of the vibration frequencies of the above-mentioned vibration elements, and a DC amplifier for DC amplifying the output of the above-mentioned phase detector. The above-mentioned second amplifier comprises at least two operational amplifiers, and at least two MOS-FETs in which the drain-source voltage is biased at 0 V, wherein one of the above-mentioned MOS-FETs is biased so that the gate-source voltage becomes constant, and the other MOS-FET is biased so that the gate-source voltage changes depending on the variation of a power source voltage, and the gains of the above-mentioned operational amplifiers are determined by the ratio of the channel resistances of the above-mentioned at least two MOS-FETs biased by the above-mentioned voltages different from each other.

An angular velocity sensor apparatus in accordance with another aspect of the present invention comprises a drive section for vibrating vibration elements, a vibration level detection section for detecting the vibration levels of the above-mentioned vibration elements, Coriolis force detection sections for detecting a Coriolis force generating depending on an angular velocity, a first amplifier for amplifying the output signal of the above-mentioned vibration level detection section, a rectifying circuit for rectifying the output signal of the above-mentioned first amplifier to obtain a DC voltage, a variable gain amplifier, receiving the output signal of the above-mentioned first amplifier, for changing its amplification degree depending on the output value of the above-mentioned rectifying circuit, a second amplifier for amplifying the output signals of the above-mentioned Coriolis force detection sections, a phase detector for detecting the phase of the output voltage of the above-mentioned second amplifier on the basis of the vibration frequencies of the above-mentioned vibration elements, and a DC amplifier for DC amplifying the output of the above-mentioned phase detector.

The above-mentioned second amplifier whose respective back gates are formed so as to be electrically isolated from a semiconductor substrate and whose respective sources are connected in common, third and fourth P-channel MOS-FETs whose respective sources are connected in common, a first voltage source for outputting a voltage obtained by dividing a power source voltage, a second voltage source for generating a positive voltage having a potential difference almost identical to the threshold voltages of the above-mentioned first, second, third and fourth MOS-FETs with reference to the output voltage of the above-mentioned first voltage source, a third voltage source for generating a predetermined negative voltage with reference to the output voltage of the above-mentioned first voltage source, first and second operational amplifiers whose positive input terminals are connected in common and biased by the above-mentioned second voltage source, the first and second P-channel MOS-FETs whose respective sources are connected in common and further connected to the output terminal of the above-mentioned first operational amplifier, and the third and fourth P-channel MOS-FETs whose respective sources are connected in common and further connected to the output terminal of the above-mentioned second operational amplifier. The respective back gates of the above-mentioned first, second, third and fourth MOS-FETs are connected to either their respective sources or the above-mentioned second voltage source, and the gates of the above-mentioned first and third MOS-FETs are connected to the above-mentioned third voltage source. The drain of the above-mentioned first MOS-FET is connected to the negative input terminal of the above-mentioned first operational amplifier and to a first input terminal to which a signal with no DC component is input. The drain of the above-mentioned third MOS-FET is connected to the negative input terminal of the above-mentioned second operational amplifier and to a second input terminal to which a signal with no DC component is input. The gates of the above-mentioned second and fourth MOS-FETs are connected to a circuit ground, the drain of the above-mentioned second MOS-FET is connected to the positive input terminal of the above-mentioned third operational amplifier, and the drain of the above-mentioned fourth MOS-FET is connected to the negative input terminal of the above-mentioned third operational amplifier. The above-mentioned second voltage source is connected to the positive input terminal of the above-mentioned third operational amplifier via a first resistor, and a second resistor is connected between the negative input terminal of the above-mentioned third operational amplifier and the output terminal of the above-mentioned third operational amplifier, which leads to the output terminal of the above-mentioned amplifier. According to the present invention, an amplifier having a sufficiently high frequency characteristics and whose gain changes in proportion to a power source voltage is used as the second amplifier, thereby making it possible to provide an angle velocity sensor having a high response speed.

BRIEF DESCRIPTION OF THE SEVERAL VIEWS OF THE DRAWING

FIG. 11a is a graph showing the relationship between the power source voltage and time in the angular velocity sensor apparatus shown in FIG. 9 in accordance with the present invention;

FIG. 11b is a graph showing the relationship between the output voltage (Vm) of the amplifier and time in the angular velocity sensor apparatus shown in FIG. 9 in accordance with the present invention;

FIG. 11c is a graph showing the relationship between the output voltage (Vout) indicating an angular velocity and time in the angular velocity sensor apparatus shown in FIG. 9 in accordance with the present invention;

FIG. 14a is the graph showing the relationship between the power source voltage and time in the conventional angular velocity sensor apparatus shown in FIG. 12.

FIG. 14b is the graph showing the relationship between the output voltage of the amplifier and time in the conventional angular velocity sensor apparatus shown in FIG. 12; and FIG. 14c is the graph showing the relationship between the output voltage indicating an angular velocity and time in the conventional angular velocity sensor apparatus shown in FIG. 12.

DETAILED DESCRIPTION OF THE INVENTION

Preferred embodiments in accordance with the present invention will be described below referring to FIG. 1 to FIG. 11.

<<First Embodiment>>

An amplifier whose gain is proportional to a power source voltage (hereafter referred to as a power source voltage proportional amplifier) in accordance with a first embodiment of the present invention will be described below referring to FIG. 1 to FIG. 3.

Figure 1:
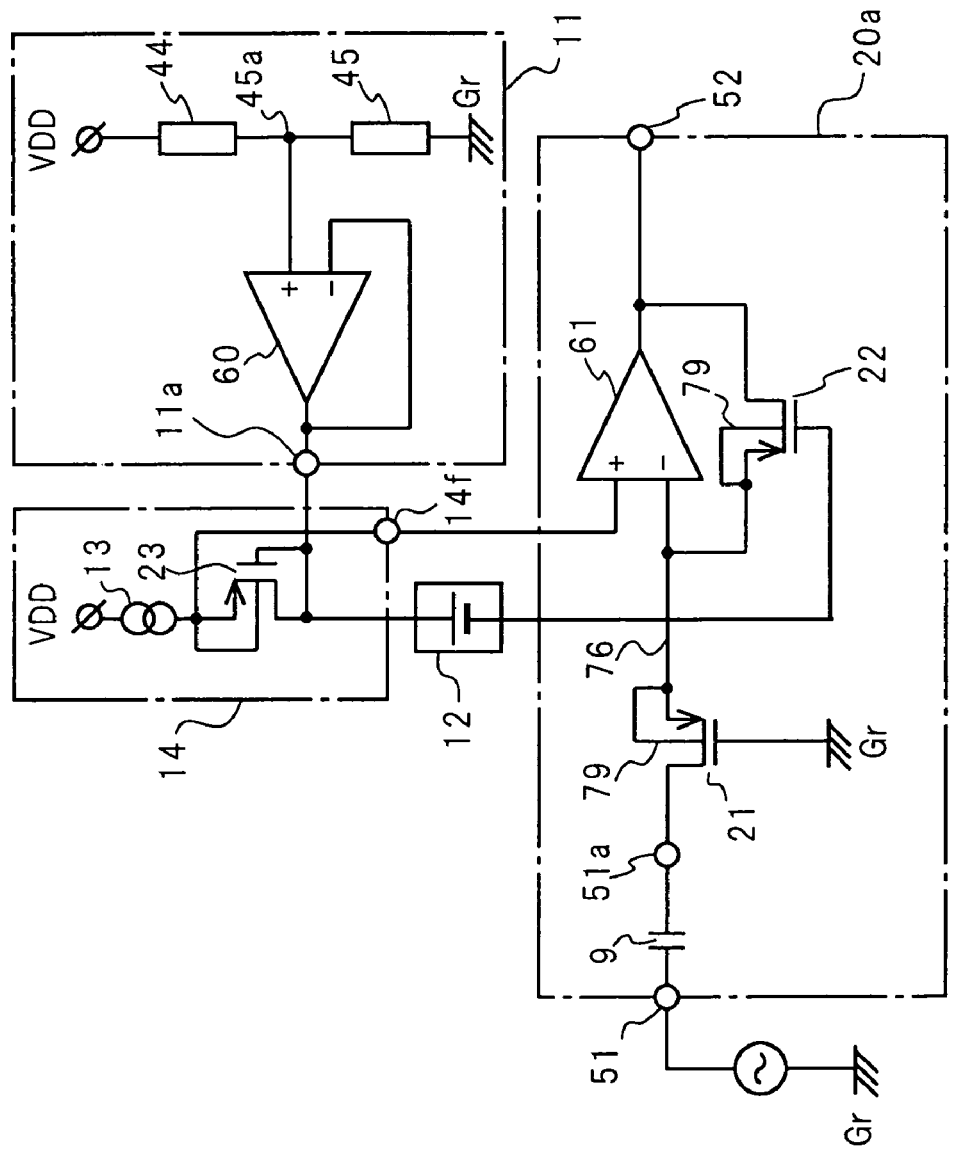
FIG. 1 is a circuit diagram showing an amplifier with a gain proportional to a power source voltage (hereinafter referred to as a power source voltage proportional amplifier) in accordance with a first embodiment of the present invention.

In FIG. 1, the power source voltage proportional amplifier in accordance with the first embodiment has an amplifier circuit 20a that amplifies an input signal and outputs an amplified signal, a bias circuit 11 serving as a first voltage source, a constant voltage source 12 and a bias circuit 14 serving as a second voltage source. The bias circuit 11 outputs a positive voltage obtained by dividing a power source voltage Vdd to an output terminal 11a. In the amplifier circuit 20a, an input terminal 51 is connected to the drain of a P-channel first MOS field-effect transistor (hereafter abbreviated to MOS-FET) 21 via a capacitor 9 for blocking DC current. In the case when an input signal applied to the input terminal 51 does not include any DC components, the input signal may be input to an input terminal 51a directly connected to the drain of the MOS-FET 21. For example, since the output signal of an angular velocity sensor detailed later is an AC output signal not including any DC components, it is input to the input terminal 51a. The gate of the MOS-FET 21 is connected to a circuit ground Gr. The source of the MOS-FET 21 is connected to the negative input terminal (−) of an operational amplifier 61. Between the negative input terminal (−) of the operational amplifier 61 and an output terminal 52, a P-channel second MOS-FET 22 is provided so that its source is connected to the negative input terminal (−) and that its drain is connected to the output terminal 52. The gate of the MOS-FET 22 is connected to the negative terminal of a constant voltage source 12 serving as a third voltage source. The positive terminal of the constant voltage source 12 is connected to the drain of a P-channel third MOS-FET 23 included in the bias circuit 14 and to the output terminal 11a of the bias circuit 11. The constant voltage source 12 generates a predetermined negative voltage with reference to the output voltage of the bias circuit 11. The bias circuit 14 outputs a positive voltage having a potential difference almost identical to the threshold voltages of the MOS-FETs 21, 22 and 23 with reference to the output voltage of the bias circuit 11 to an output terminal 14f. The positive input terminal (+) of the operational amplifier 61 is connected to the source of the third MOS-FET 23. The source of the MOS-FET 23 is connected to a power source VDD via a constant current source 13. The drain and gate of the MOS-FET 23 are connected to the output terminal 11a of a second operational amplifier 60. In the bias circuit 11, resistors 44 and 45 are connected in series between the power source VDD and the circuit ground Gr. The connection point 45a of the resistors 44 and 45 is connected to the positive input terminal (+) of the second operational amplifier 60. The negative input terminal (−) of the operational amplifier 60 is connected to the output terminal 11a of the second operational amplifier 60. A power source for the operational amplifiers 61 and 60 is not shown.

The operation of the power source voltage proportional amplifier in accordance with this embodiment configured as described above will be described below. Since no DC current flows into the drain of the MOS-FET 21, the negative input terminal (−), the output terminal 52 and the positive input terminal (+) of the operational amplifier 61 have the same potential.

While an MOS-FET, such as the MOS-FETs 21 and 22, operates in an unsaturated state, its drain current Ids is generally represented by the following equation (1).

$$Ids = \beta \cdot \{(Vgs-Vth) \cdot Vds - (Vds)^2/2\} \quad (1)$$

wherein $\beta$ is a mutual conductance per unit gate voltage, Vgs is a gate-source voltage, Vth is a gate-source threshold voltage at the time when the MOS-FET turns on, and Vds is a drain-source voltage. In addition, the ON resistance Ron of the MOS-FET is the inverse number of a value obtained by differentiating the drain current Ids obtained according to the equation (1) with respect to the drain-source voltage Vds, and is represented by equation (2).

$$Ron = 1/(dIds/dVds) \quad (2)$$

From the equations (1) and (2), equation (3) is obtained.

$$dIds/dVds = \beta \cdot \{(Vgs-Vth)-Vds\} \quad (3)$$

In the case when no bias voltage is applied between the drain and source, that is, in the case of zero bias, the drain-source voltage Vds is zero. Hence, the second term on the right side of the equation (3) disappears. As a result, the equation (2) becomes equation (4).

$$Ron = 1/\{\beta \cdot (Vgs-Vth)\} \quad (4)$$

According to the equation (4), it is found that the ON resistance Ron of the MOS-FET is inversely proportional to the product of the mutual conductance $\beta$ and the voltage difference (Vgs−Vth) when the drain-source voltage Vds is zero. Since the mutual conductance $\beta$ is determined by the production process and the size of each of the MOS-FETs 21 and 22, it is a constant value. When the ON resistance Ron of the MOS-FET is used as an input resistance for determining the gain of an operational amplifier, a circuit wherein the voltage difference (Vgs−Vth) serving as a bias voltage is proportional to the power source voltage Vdd is configured, whereby it is found that an amplifier whose gain is proportional to the power source voltage Vdd is obtained.

In the bias circuit 11 shown in FIG. 1, the potential at the connection point 45a of the resistors 44 and 45 is impedance-converted by the operational amplifier 60 and output to its output terminal 11a.

To the source of the MOS-FET 23, a constant minute current (constant current) flows from the constant current source 13 connected to the power source VDD. By this constant current, a bias current corresponding to the threshold voltages Vth of the MOS-FETs 21 and 22 is generated between the output voltage 11a of the operational amplifier 60 and the positive input terminal (+) of the operational amplifier 61, whereby the input DC bias of the, operational amplifier 61 is level-shifted. Hence, the threshold voltages Vth of the MOS-FETs 21 and 22 are cancelled. It is desired that the value of the constant current should be as small as possible. It is also desired that the gate width of the MOS-FET 23 should be as large as possible.

The gate bias voltage of the MOS-FET 22 operating as the feedback resistor of the operational amplifier 61 of the amplifier circuit 20a is made negative with reference to the output voltage of the operational amplifier 60. This negative voltage is applied from the constant voltage source 12. With the above-mentioned configuration, the ON resistance of the MOS-FET 22 does not change even if the bias voltages of the negative input terminal (−) and the positive input terminal (+) of the operational amplifier 61 varies depending on the variation of the power source voltage Vdd. On the other hand, the ON resistance of the MOS-FET 21 decreases in inverse proportion to the power source voltage Vdd. By virtue of the above-mentioned operation, the gain of the amplifier circuit 20a having the MOS-FETs 21 and 22 and the operational amplifier 61 becomes proportional to the power source voltage Vdd.

The source potential Vso of the MOS-FETs 21 and 22 is a bias voltage of the negative input terminal (−) of the operational amplifier 61 with respect to the circuit ground Gr and is represented by the following equation (5).

$$Vso = \{R45/(R44+R45)\} \cdot Vdd - Vgs23 \quad (5)$$

wherein R44 and R45 are the resistance values of the resistors 44 and 45, respectively, and Vdd is the power source voltage. Vgs23 is the gate-source voltage of the MOS-FET 23 and its polarity is negative since the FET is a P-channel FET.

Using the gate-source voltage Vgs and the threshold voltage Vth, the drain-source current Ids of the MOS-FET 23 is represented by the following general equation (6) when the operation of the MOS-FET is saturated.

$$Ids=(\beta/2)\cdot(Vgs-Vth)^2 \qquad (6)$$

When it is assumed that the drain-source current of the MOS-FET 23 is Ids23, that the mutual conductance per unit gate voltage thereof is β23 and that the gate-source voltage thereof is Vgs23, the equation (6) becomes the following equation (6A).

$$Ids23=(\beta23/2)\cdot(Vgs23-Vth)^2 \qquad (6A)$$

When the equation (6A) is solved with respect to the gate-source voltage Vgs23, equation (7) is obtained.

$$Vgs23 = \sqrt{2\cdot Ids23/\beta23}+Vth \qquad (7)$$

In the case when the ratio 2·Ids23/β23 in the equation (7) is far smaller than the threshold voltage Vth, that is, when 2·Ids23/β23<<Vth, the equation (7) becomes equation (8).

$$Vgs23 \approx Vth \qquad (8)$$

In order that the ratio 2·Ids23/β23 is made small, the current supplied from the constant current source 13 is decreased, the channel length of the gate of the MOS-FET 23 is decreased as small as possible and the channel width thereof is increased as large as possible as detailed later. The condition of the equation (8) can thus be attained.

The gate-source voltage Vgs21 of the MOS-FET 21 is represented by equation (9) using the equations (5) and (8).

$$Vgs21=Vth-\{R45/(R44+R45)\}\cdot Vdd \qquad (9)$$

When it is assumed that the mutual conductance per unit gate voltage is β21, the ON resistance Ron21 of the MOS-FET 21 is obtained by substituting Vgs21 in Vgs of the equation (4), as represented by equation (10).

$$Ron21=1/[-\beta21\cdot\{R45/(R44+R45)\}\cdot Vdd] \qquad (10)$$

According to the equation (10), it is found that the threshold voltage Vth is eliminated and that the ON resistance Ron is inversely proportional to the power source voltage Vdd. The minus sign is attached to β21 since the MOS-FET 21 is a P-channel FET and β21 itself is negative.

When similar calculations are carried out for the MOS-FET 22, the gate-source voltage Vgs22 can be represented by equation (11).

$$Vgs22=\{R45/(R44+R45)\}\cdot Vdd-V12-Vso \qquad (11)$$

wherein V12 is the voltage value of the constant voltage source 12. When Vso of the equation (5) is substituted and the equation (11) is arranged, the equation (11) becomes equation (12).

$$Vgs22=-V12+Vgs23 \qquad (12)$$

In a similar manner to the MOS-FET 21, when a mutual conductance of the MOS-FET 22 per unit gate voltage in β22, the ON resistance Ron22 of the MOS-FET 22 is represented by equation (13) obtained by substituting Vgs22 in Vgs of the equation (4).

$$Ron22=1/\{\beta22\cdot(-V12+Vgs23-Vth)\} \qquad (13)$$

Since Vgs23≈Vth according to the equation (8), Vgs23 and Vth in the equation (13) are offset with each other, whereby the equation (13) becomes equation (14).

$$Ron22=1/\{\beta22\cdot(-V12)\} \qquad (14)$$

Since the voltage V12 of the constant voltage source 12 is constant, it is found according to the equation (14) that the ON resistance of the MOS-FET 22 is constant regardless of the power source voltage Vdd.

In order that the gain G between the input terminal 51a and the output terminal 52 of the amplifier circuit 20a shown in FIG. 1 is obtained, the equation (1) and the equation (14) are substituted in equation (15), a formula for an inverting amplifier. As a result, equation (16) is derived.

$$G=Ron22/Ron21 \qquad (15)$$

$$G=(\beta21/\beta22)\cdot\{R45/(R44+R45)\}\cdot(Vdd/V12) \qquad (16)$$

When the value of the resistor 44 is the same as that of the resistor 45, that is, when R44= R45, the equation (16) is simplified to equation (17).

$$G=(\beta21/\beta22)\cdot\{Vdd/(2\cdot V12)\} \qquad (17)$$

Since the power source voltage Vdd is included in the numerator of the equation indicating the gain G as indicated in the equation (16) and the equation (17), the gain G is proportional to the power source voltage Vdd.

In the power source voltage proportional amplifier in accordance with this embodiment described above, the circuit comprising the P-channel MOS-FETs 21, 22 and 23 is explained as an example. However, even when N-channel MOS-FETs are used, the power source voltage proportional amplifier in accordance with this embodiment can be configured similarly.

It can be understood easily that the gain becomes inversely proportional to the power source voltage Vdd when the gate biases of the MOS-FETs 21 and 22 of P-channel are reversed.

In FIG. 1, the back gates 79 of the MOS-FETs 21 and 22 are connected to their respective sources 76, and the sources 76 are connected to the negative input terminal (−) of the operational amplifier 61. Since the potentials at the two input terminals of the operational amplifier 61 are the same (imaginary short-circuit) during normal operation, the back gates 79 of the MOS-FETs 21 and 22 may be connected to the positive input terminals (+) of the operational amplifier 61 as shown in FIG. 2. Hence, the back gates 79 are connected to the output terminal 14f of the bias circuit 14. The present invention is basically configured so that the potential of the back gate is biased so as to be almost identical to the source-drain voltage. Hence, MOS-FETs formed in N-wells or P-wells are used so that the back gates can be electrically isolated from the substrate. Even the circuit shown in FIG. 2 provides a power source voltage proportional amplifier which carries out an operation similar to that of the circuit shown in FIG. 1 and whose gain G is proportional to the power source voltage Vdd.

The P-channel MOS-FETs 21, 22 and 23 for this embodiment are semiconductor devices having a well-known structure. The structure will be described briefly referring to a cross-sectional view in FIG. 3. An N-type diffusion layer referred to as an N-well 71 in the technical field related to the present invention is formed in the vicinity of the upper face of a P-type semiconductor substrate 70 obtained by adding predetermined impurities to a semiconductor material, such as silicon. The N-well is a name in view of a structure and is frequently referred to as a back gate in view of a circuit configuration. Hence, the N-well 71 is referred to as a back gate 71. Two (P+)-type diffusion layers 72a and 72b arranged side by side with a predetermined space therebetween are provided in the back gate 71. An (N+)-type diffusion layer 73 is provided in the right region of the back gate. A source terminal 76 is connected to the (P+)-type diffusion layer 72a, and a drain terminal 77 is connected to the (P+)-type diffusion layer 72b. A back gate terminal 79 is connected to the (N+)-type diffusion layer 73. An insulating film 74 made of silicon oxide ($SiO_2$) is provided on the upper face of the substrate 70 configured as described above. A conductive polysilicon film 75 is provided to face a channel region CH between the (P+)-type diffusion layers 72a and 72b via the insulating film 74. A gate terminal 78 is connected to the polysilicon film 75. The actual MOS-FETs 21 to 23 are each formed of an integrated circuit (hereafter referred to as an IC), and aluminum wires, protective films, etc. are provided on the polysilicon film 75. However, such aluminum wires, protective films, etc. are not shown. The source terminal 76, the drain terminal 77, the gate terminal 78, and the back gate terminal 79 represent the terminals for electrically connecting the MOS-FETs to the other circuits, of which configurations are different from those of normal terminals. Since the P-type semiconductor substrate 70 and the N-type back gate 71 are conductive types different from each other, a reverse bias voltage is applied between them in this embodiment so that the semiconductor substrate 70 and the back gate 71 are electrically isolated from each other. Since the (P+)-type diffusion layers 72a and 72b are the same in structure, no problem occurs even if the source terminal 76 and the drain terminal 77 are replaced with each other. Although the back gate terminals 79 of the MOS-FETs 21, 22 and 23 are connected to the source terminal 76 in the circuit shown in FIG. 1, the back gate terminals 79 may be connected to the output terminal 14f of the bias circuit 14 as shown in FIG. 2. In the present invention, the circuit is configured so that DC current does not flow in MOS-FETs 21 and 22 as shown in FIG. 1, hence developing no voltage drop. Since a zero bias is applied between the source and the drain, even when the back gate is connected to the drain, a gain almost proportional to the power source voltage can be obtained in the case when a signal is low.

Since a zero bias is applied between the source and the drain in this embodiment, almost identical characteristics are obtained actually even if the source terminal 76 and the drain terminal 77 are replaced with each other. However, even if the DC bias voltage is 0 V, if the level of a signal to be applied is high, a small potential difference is generated between the source and the drain. When the potential difference is about 0.1 V, for example, no problem occurs. However, as the potential difference becomes larger than this value, errors occur in the above-mentioned calculation equations.

Figure 3:
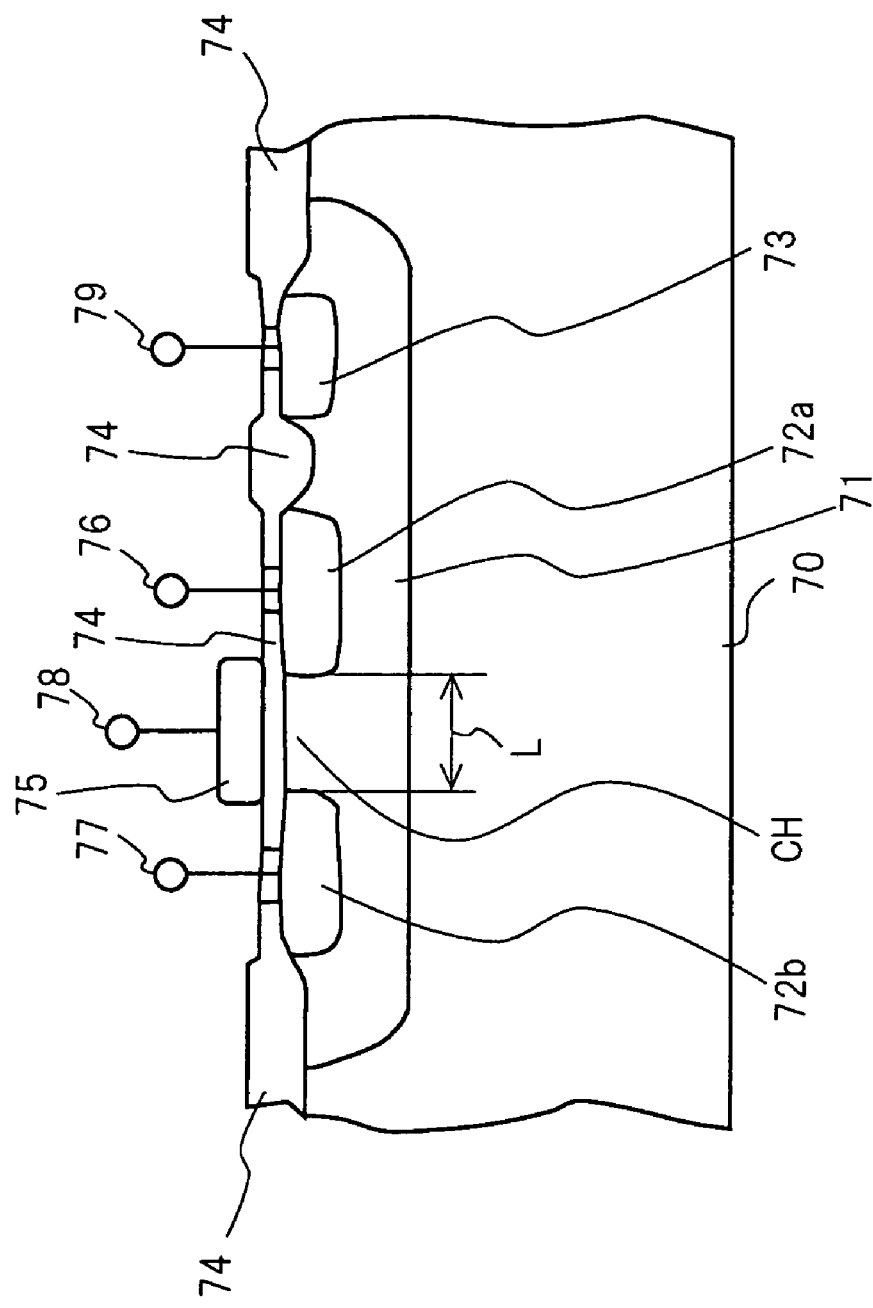
FIG. 3 is a cross-sectional view showing a P-channel MOS-FET for use in the power source voltage proportional amplifier in accordance with the first embodiment of the present invention.

In addition, the size of the channel significantly affects the characteristics of the MOS-FET as explained below. The mutual conductance β per unit gate voltage, used in the above-mentioned equation (1), and the size of the channel have the relationship indicated by the following equation (18).

$$\beta \propto (W/L) \quad (18)$$

wherein W/L represents the dimension ratio of the channel region CH in the back gate 71 facing the polysilicon film 75 in FIG. 3. W is a channel width, that is, the length of each of the (P+)-type diffusion layers 72a and 72b in a direction vertical to the face of FIG. 3. L is a channel length, that is, the distance between the (P+)-type diffusion layers 72a and 72b. The area of the channel region of the MOS-FET increases or decreases depending on the channel width W and the channel length L. When the value of W/L changes, the mutual conductance β also changes in proportion to the value.

According to the equation (18), it is found that the ON resistance of the MOS-FET, such as the MOS-FETs 21 and 22, configured as shown in FIG. 3 becomes smaller as the channel width W is larger and the channel length is smaller. It is preferable that the mutual conductance β is larger as described above in the case of the MOS-FET 23 shown in FIG. 1. However, in actuality, it is desirable that the channel length of the MOS-FET 23 should be made identical to those of the MOS-FETs 21 and 22. The channel width W of the MOS-FET 23 is set at a value close to those of the MOS-FETs 21 and 22 within the allowable variation range of the area of the channel region. This is because the bias circuit 14 shown in FIG. 1 is a circuit that generates a voltage almost identical to the threshold voltages of the MOS-FETs 21 and 22.

In addition, the calculations in accordance with the above-mentioned calculation equations are carried out on the assumption that the potential of the back gate terminal 79 of each of the MOS-FETs 21, 22 and 23 is identical to that of the source terminal 76 thereof. However, it is not always necessary that the respective back gate terminals 79 are connected in common with their corresponding source terminals 76. The potentials of the back gate terminals 79 of the MOS-FETs 21, 22 and 23 should only be identical to one another. Since the structure of the MOS-FET 23 of the bias circuit 14 is identical to those of the MOS-FETs 21 and 22, the threshold voltages of the MOS-FETs 21, 22 and 23 change similarly at all times. As a result, when the potentials of all the source terminals 76 of the MOS-FETs are the same, the variation of the threshold voltage owing to the back-gate effect is cancelled. However, as the threshold voltage becomes higher owing to the back-gate effect, the accuracy of proportion at the time when the gain is proportional to the power source voltage becomes worse.

Figure 2:
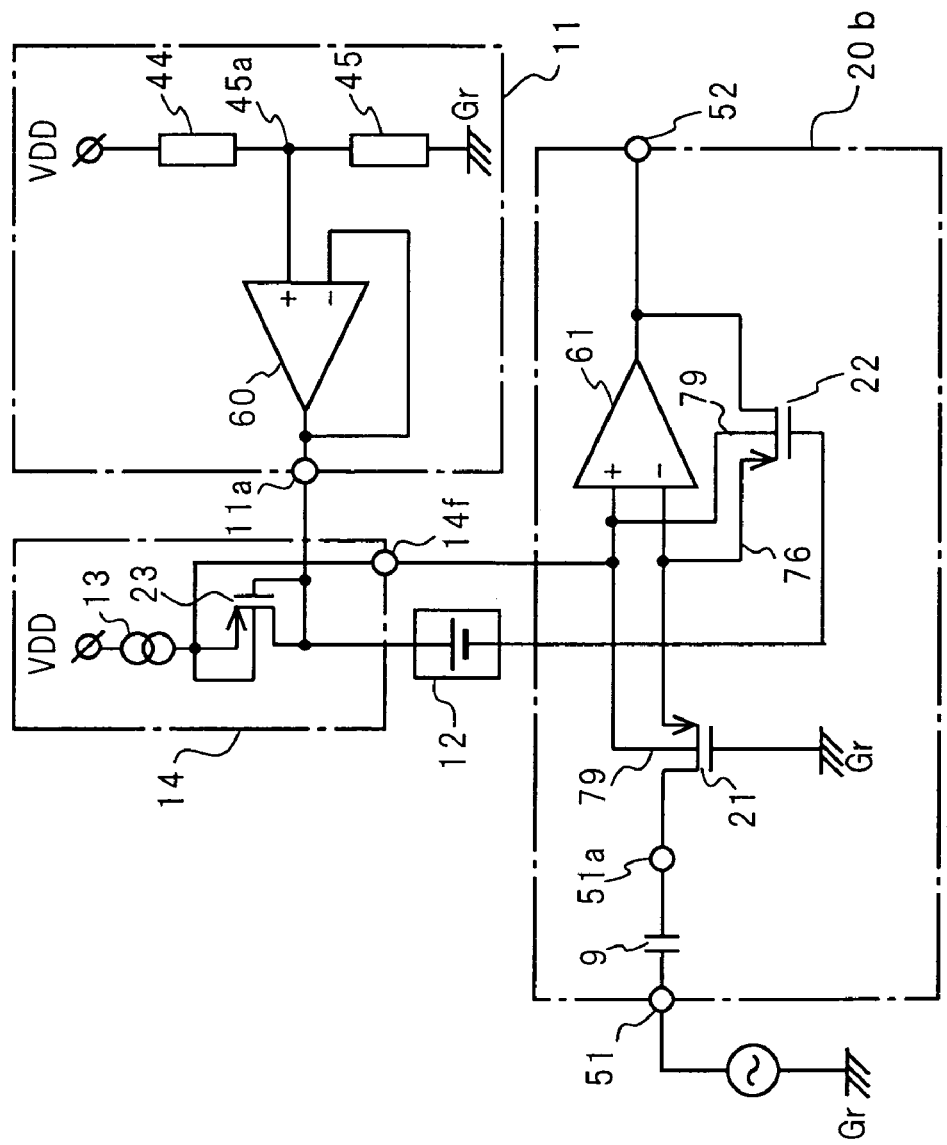
FIG. 2 is another circuit diagram showing a power source voltage proportional amplifier in accordance with the first embodiment of the present invention.

FIG. 2 shows a circuit example wherein the back gate terminals 79 of the MOS-FETs 21 and 22 are not connected to their respective source terminals 76, in the power source voltage proportional amplifier in accordance with this embodiment. The MOS-FETs 21 and 22 shown in FIG. 2 are completely identical to the corresponding MOS-FETs shown in FIG. 1. In FIG. 2, both the back gate terminals 79 of the MOS-FETs 21 and 22 are connected to the positive input terminal (+) of the operational amplifier 61. During normal operation, the negative input terminal (−) and the positive input terminal (+) of the operational amplifier 61 are in the imaginary short-circuit state. Hence, the potential of the positive input terminal (+) of the operational amplifier 61 is almost identical to that, of its negative input terminal (−) to which the source terminals 76 of the MOS-FETs 21 and 22 are connected. Therefore, the same actions and effects as those of the configuration shown in FIG. 1 can be obtained from the configuration shown in FIG. 2.

<<Second Embodiment>>

A power source voltage proportional amplifier in accordance with a second embodiment of the present invention will be described referring to FIG. 4. Although the power source voltage proportional amplifier in accordance with the above-mentioned first embodiment is configured by using the P-channel MOS-FETs 21, 22 and 23, the power source voltage proportional amplifier in accordance with the second embodiment is configured by using N-channel MOS-FETs.

Figure 4:
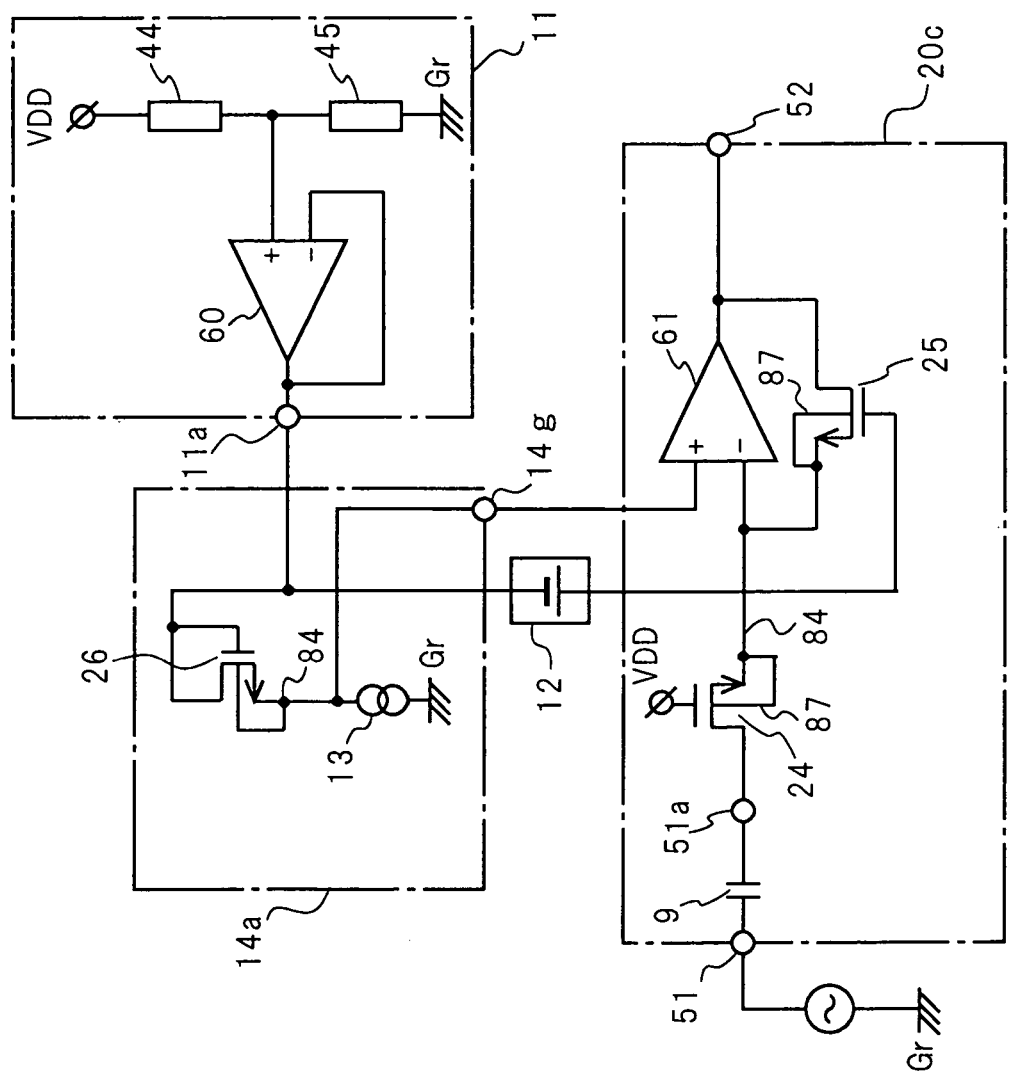
FIG. 4 is a circuit diagram showing a power source voltage proportional amplifier in accordance with a second embodiment of the present invention.

As shown in FIG. 4, in the N-channel MOS-FETs 24, 25 and 26, the gate of the MOS-FET 24 operating as an input resistor is connected to a voltage source VDD. The positive terminal of a constant voltage source 12 (third voltage source) is connected to the gate of the MOS-FET 25. The source terminal 84 of the MOS-FET 26 in a bias circuit 14*a* (second voltage source) is connected to a circuit ground Gr via a constant current source 13. The output terminal 14*g* of the bias circuit 14*a* is connected to the connection point of the source terminal 84 and the constant current source 13. The other sections are similar to those of the configuration of the power source voltage proportional amplifier in accordance with the above-mentioned first embodiment shown in FIG. 1. Equations in accordance with this embodiment can be obtained by positive-negative reversal of the values in the above-mentioned equations. However, the equations are not described. Also in the power source voltage proportional amplifier in accordance with this embodiment, an input signal input from an input terminal 51*a*, including no DC component, is amplified depending on a gain changing depending on the change of a power source voltage Vdd and output from an output terminal 52.

Figure 5:
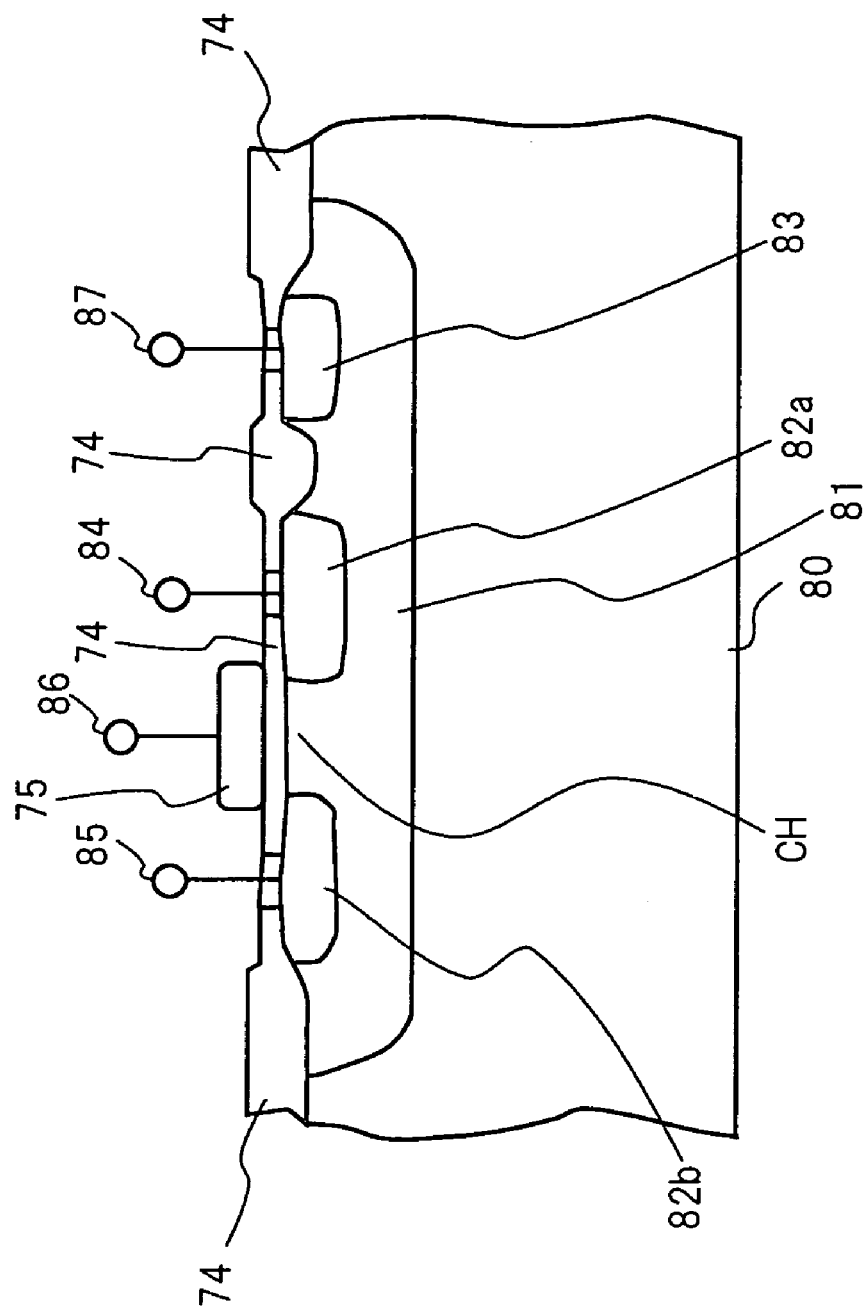
FIG. 5 is a cross-sectional view showing an N-channel MOS-FET for use in the power source voltage proportional amplifier in accordance with the second embodiment of the present invention.
Figure 6:
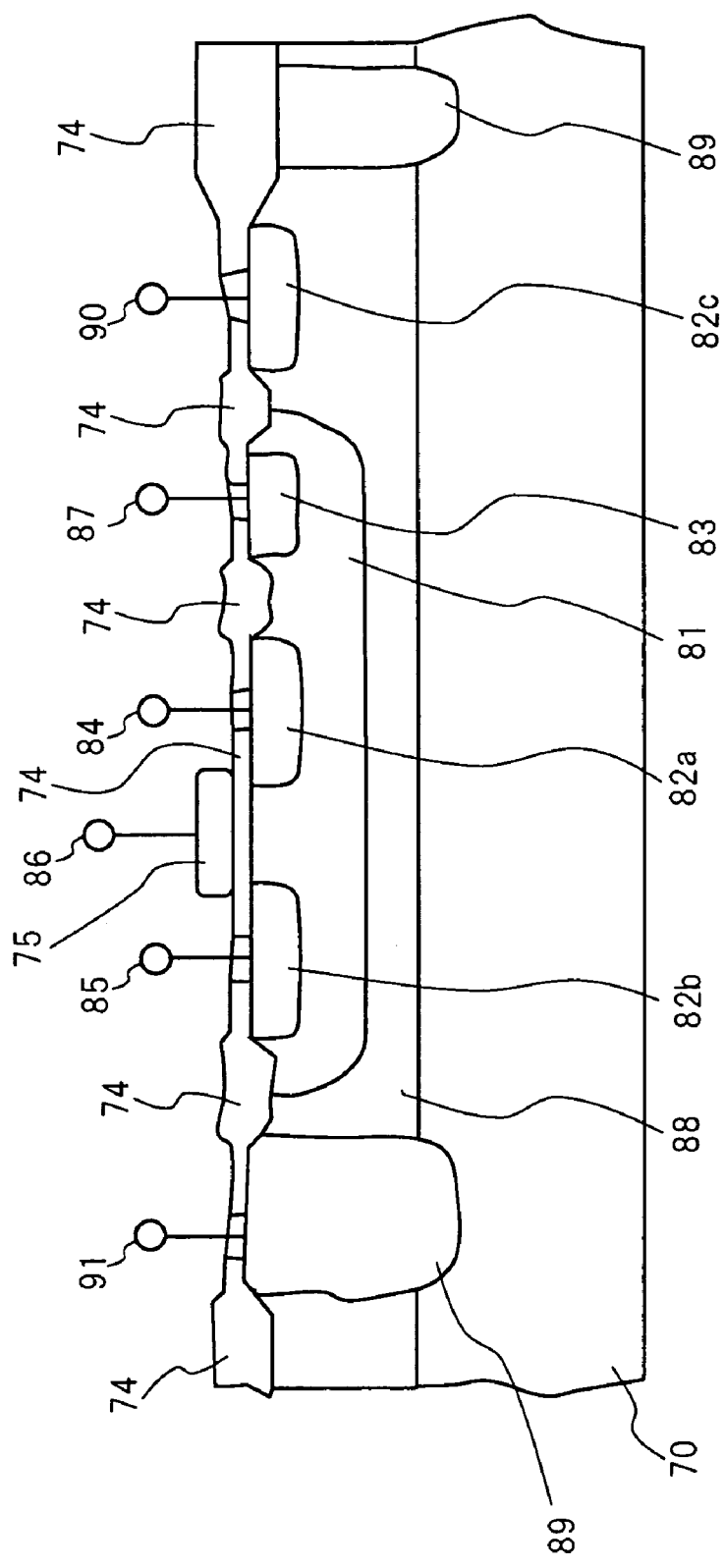
FIG. 6 is a cross-sectional view showing another N-channel MOS-FET for use in the power source voltage proportional amplifier in accordance with the second embodiment of the present invention.

FIG. 5 and FIG. 6 are cross-sectional views showing two examples of N-channel MOS-FETs having well-known structures.

FIG. 5 shows a structural example of an N-channel MOS-FET having the simplest structure and used as the MOS-FETs 24, 25 and 26 of the power source voltage proportional amplifier in accordance with the second embodiment shown in FIG. 4. A P-type diffusion layer (P-well) is formed in the vicinity of the upper face of an N-type substrate 80 obtained by adding predetermined impurities to a semiconductor material, such as silicon. The P-well is referred to as a back gate 81. Two (N+)-type diffusion layers 82*a* and 82*b* arranged so as to have a predetermined space therebetween are provided in the back gate 81. A (P+)-type diffusion layer 83 is provided in the right region of the back gate 81. A source terminal 84 is connected to the (N+)-type diffusion layer 82*a*, and a drain terminal 85 is connected to the (N+)-type diffusion layers 82*b*. A back gate terminal 87 is connected to the (P+)-type diffusion layer 83. An insulating film 74 made of $SiO_2$ is provided on the upper face of the substrate 80 configured as described above. A conductive polysilicon film 75 is provided to face a channel region CH between the (N+)-type diffusion layers 82*a* and 82*b* via the insulating film 74. A gate terminal 86 is connected to the polysilicon film 75. As described above, the P-type and N-type elements in the configuration shown in FIG. 5 are reversely related to those in the configuration shown in FIG. 3.

FIG. 6 is a cross-sectional view showing another structure of the N-channel MOS-FET. This structure is frequently used for bipolar semiconductor devices. In FIG. 6, an N-type epitaxial layer 88 is provided on a P-type semiconductor substrate 70. The epitaxial layer 88 is partitioned by (P+)-type separation-diffusion regions 89 having an impurity concentration higher than that of the epitaxial layer 88. A P-channel MOS-FET having the same configuration as that shown in FIG. 5 is formed in the N-type epitaxial layer 88 partitioned by the separation-diffusion regions 89. An (N+)-type diffusion layer 82C is provided so as to be electrically connected to the N-type epitaxial layer 88, and an epitaxial layer terminal 90 is provided on the (N+)-type diffusion layer 82C. The (N+)-type diffusion layer 82C is formed in the same process as that for the (N+)-type diffusion layers 82*a* and 82*b*. The epitaxial layer terminal 90 is usually connected to the voltage source VDD, but it may be in a floating state, without being connected to anywhere. Circuit elements, such as P-type diffusion resistors, required for amplification wherein the gain of this embodiment is proportional to a power source voltage can be provided in the N-type epitaxial layer 88. Each of the MOS-FETs for the power source voltage proportional amplifier in accordance with this embodiment has a structure wherein the back gate can be electrically isolated from the semiconductor substrate. However, MOS-FETs other than those shown in FIG. 3, FIG. 5 and FIG. 6 can also be used, provided that they have this kind of structure. The MOS-FET of N-channel generally has greater noise of low frequency than the MOS-FET of P-channel has. Accordingly, the MOS-FET of P-channel is preferably used in the apparatus having low input signal levels.

As indicated in the above-mentioned equation (15), the gain G of the power source voltage proportional amplifier in accordance with the first embodiment is represented by the ratio of the ON resistances of the MOS-FETs 21 and 22, that is, the ratio Ron(22)/Ron(21). Similarly, the gain G of the power source voltage proportional amplifier in accordance with the second embodiment is represented by the ratio of the ON resistances of the MOS-FETs 24 and 25, that is, Ron(25)/Ron(24). In the case when the relationship between the MOS-FETs 21 and 22 are reversed in the first embodiment, that is, when the gate connections of the MOS-FETs 21 and 22 are replaced with each other so that the gate bias voltage of the MOS-FET 21 is fixed and so that the gate bias voltage of the MOS-FET 22 is proportional to the power source voltage Vdd, the ON resistance of the MOS-FET 22 serving as a feedback resistor changes in inversely proportional to the power source voltage Vdd. In the case when the relationship between the MOS-FETs 24 and 25 are reversed in the second embodiment, that is, when the gate connections of the MOS-FETs 24 and 25 are replaced with each other so that the gate bias voltage of the MOS-FET 24 is fixed and so that the gate bias voltage of the MOS-FET 25 is proportional to the power source voltage Vdd, the ON resistance of the MOS-FET 25 serving as a feedback resistor changes in inversely proportional to the power source voltage Vdd. As a result, it is possible to obtain an amplifier whose gain is inversely proportional to the power source voltage Vdd.

<<Third Embodiment>>

Figure 7:
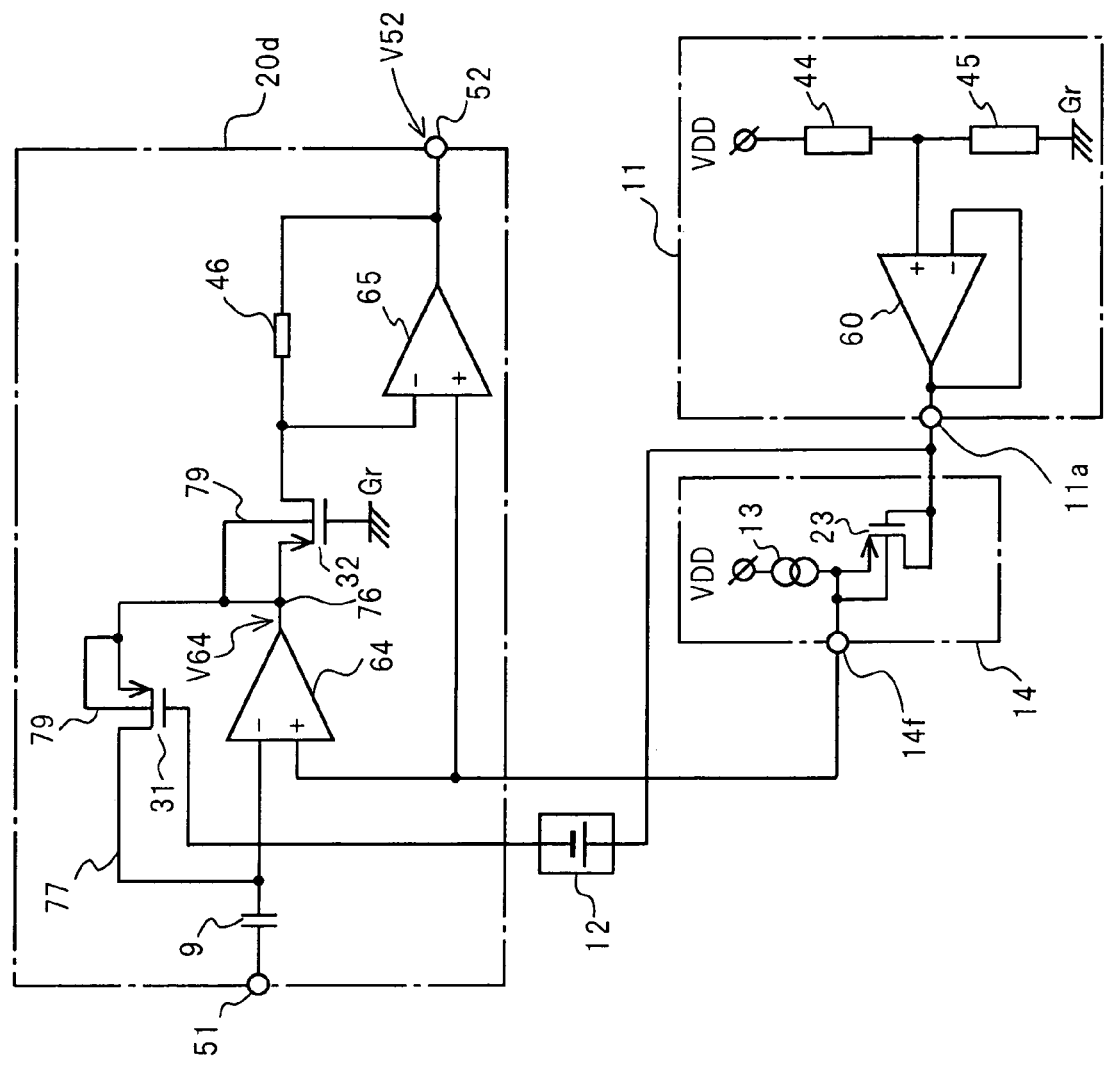
FIG. 7 is a circuit diagram showing a power source voltage proportional amplifier in accordance with a third embodiment of the present invention.

A power source voltage proportional amplifier in accordance with a third embodiment of the present invention will be described referring to a circuit diagram shown in FIG. 7. In FIG. 7, a constant voltage source 12 and bias circuits 11 and 14 are the same as those shown in FIG. 1, and their explanations are omitted to avoid overlaps. An amplifier circuit 20*d* has a first operational amplifier 64 and a second operational amplifier 65. The negative input terminal (−) of the first operational amplifier 64 is connected to the input terminal 51 of the amplifier circuit 20*d* via a capacitor 9 and the positive input terminal (+) is connected to the output terminal 14*f* of the bias circuit 14. The output terminal of the second operational amplifier 65 is connected to the output terminal 52 of the amplifier circuit 20*d*. A resistor 46 is connected between the negative input terminal (−) of the second operational amplifier 65 and the output terminal 52. The sources 76 of two P-channel MOS-FETs 31 and 32 are connected in common and further connected to the output terminal of the operational amplifier 64. The gate of the MOS-FET 31 is connected to the negative terminal of the constant voltage source 12, and the drain 77 thereof is connected to the negative input terminal of the operational amplifier 64. The gate of the MOS-FET 32 is connected to a circuit ground Gr, and its drain is connected to the negative input terminal (−) of the operational amplifier 65. The positive input terminal (+) of the operational amplifier 65 is connected to the output terminal 14f of the bias circuit 14. The back-gate terminals 79 of the MOS-FETs 31 and 32 are connected to their respective sources 76. The back-gate terminals 79 may be connected to the bias circuit 14.

For example, a detection element of an angle velocity sensor having a tuning fork structure is an element of outputting current. When an input current flows into the input terminal 51, the operational amplifier 64 and the MOS-FET 31 serving as the feedback resistor of the operational amplifier 64 operate as a current-voltage converter. In addition, the operational amplifier 65, the MOS-FET 32 and the resistor 46 form an ordinary inverting amplifier. Hence, the gain G between the input terminal 51 and the output terminal 52 is the product of the gain of the current-voltage converter and the gain of inverting amplifier. The gain G is thus obtained by using the following equations (19) to (26).

It is assumed that an input signal is a current signal that is input from, for example, an angular velocity sensor having a tuning-fork structure and serving as a signal source. The dependence of the output voltage V52 of the output terminal 52 on the power source voltage Vdd of the power source VDD is calculated. Assuming that the open loop gains of the operational amplifiers 64 and 65 are very high, the following three equations (19), (20) and (21) are established.

$$V52 = V64 \cdot G65 \quad (19)$$

$$V64 = Iin \cdot Ron31 \quad (20)$$

$$G65 = R46/Ron32 \quad (21)$$

wherein V64 is the output voltage of the operational amplifier 64, G65 is the gain of the operational amplifier 65, Iin is the current of the signal from the signal source, Ron31 is the ON resistance of the MOS-FET 31, Ron32 is the ON resistance of the MOS-FET 32, and R46 is the resistance value of the resistor 46. Since the ON resistance of the MOS-FET is as explained before in detail referring to FIG. 1 and the bias circuits shown in FIG. 1 and those shown in FIG. 7 are completely the same, Ron31 is represented by the following equation (22) according to the equation (14), and Ron32 is represented by the following equation (23) according to the equation (10).

$$Ron31 = 1/\{\beta 31 \cdot (-V12)\} \quad (22)$$

$$Ron32 = 1/[-\beta 32 \cdot \{R45/(R44+R45)\} \cdot Vdd] \quad (23)$$

wherein β31 and β32 are the mutual conductance values per unit gate voltage of the MOS-FETs 31 and 32, respectively, and V12 is the voltage of the constant voltage source 12.

The following equations (24) and (25) are obtained by substituting the equations (22) and (23) in the equations (20) and (21), respectively.

$$V64 = Iin/\{\beta 31 \cdot (-V12)\} \quad (24)$$

$$G65 = R46 \cdot [-\beta 32 \cdot \{R45/(R44+R45)\} \cdot Vdd] \quad (25)$$

Furthermore, the output voltage V52 of the amplifier circuit 20d is obtained by multiplying the equation (24) by the equation (25) and represented by equation (26).

$$V52 = (\beta 32/\beta 31) \cdot \{R45/(R44+R45)\} \cdot (Vdd/V12) \cdot R46 \cdot Iin \quad (26)$$

Since the power source voltage Vdd is included in the equation (26) so as to be multiplied, it is found that the output voltage 52 of the amplifier circuit 20d is proportional to the power source voltage Vdd according to this equation (26). The equation (26) is different from the equation (17) for calculating the gain on the basis of the configuration shown in FIG. 1 in (β32/β31) and the last term R46·Iin. Since the ratio (β32/β31) represents the gate size of an MOS-FET, when the MOS-FET 21 shown in FIG. 1 is replaced with the MOS-FET 32 shown in FIG. 7 and when the MOS-FET 22 shown in FIG. 1 is replaced with the MOS-FET 31 shown in FIG. 7, the equation (26) becomes different from the equation (17) in the last term R46·Iin. Since the resistor 46 is an ordinary fixed resistor having a fixed resistance value, if the current of the signal source is constant, this term does not depend on the power source voltage. Therefore, the gain of the amplifier circuit 20d is proportional to the power source voltage.

<<Fourth Embodiment>>

Figure 8:
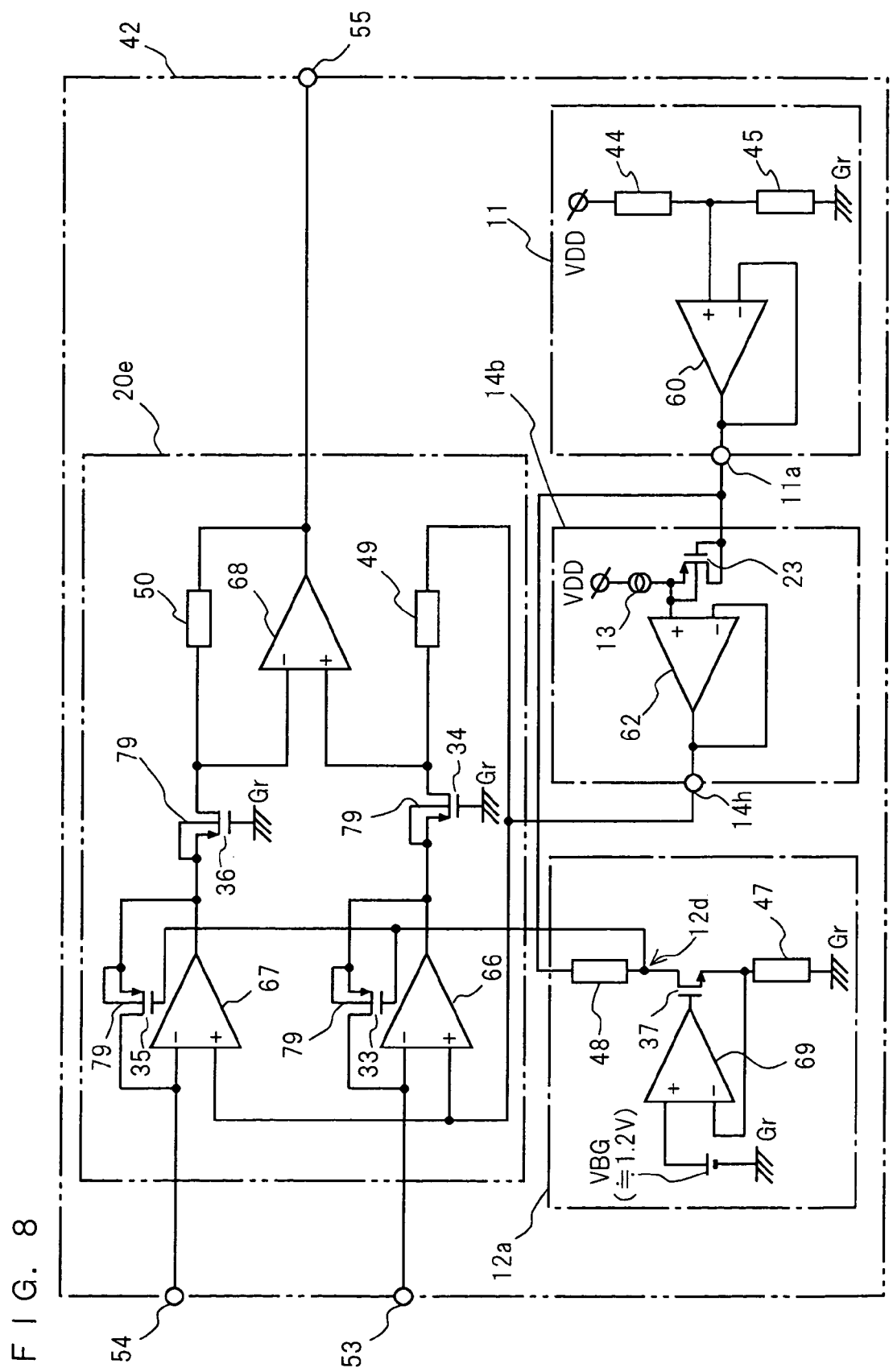
FIG. 8 is a circuit diagram showing a power source voltage proportional amplifier in accordance with a fourth embodiment of the present invention.

A fourth embodiment of the present invention relates to a power source voltage proportional amplifier with two inputs, which is configured by applying the circuit shown in FIG. 7 in accordance with the above-mentioned third embodiment so as to amplify two signal currents having polarities opposite to each other (positive and negative). FIG. 8 is a circuit diagram showing a power source voltage proportional amplifier in accordance with the fourth embodiment. In FIG. 8, a bias circuit 11 serving as a first voltage source is the same as that shown in FIG. 1 and outputs a bias voltage depending on the power source voltage Vdd of a power source VDD to the output terminal 11a. A bias circuit 14b serving as a second voltage source is a threshold voltage generation circuit wherein an operational amplifier 62 is added to the bias circuit 14 shown in FIG. 1 and FIG. 7 so as to serve as a buffer amplifier in the form of a voltage follower. The bias circuit 14b outputs a positive voltage having a potential difference almost identical to the threshold voltages of MOS-FETs 33, 34, 35 and 36. A constant voltage source 12a outputs a constant voltage 12d. Accordingly, the output of the bias circuit 14b corresponds to an output from an output terminal 14h of the operational amplifier 62. The configuration of the constant voltage source 12a shown in FIG. 8 is a concrete circuit configuration of the constant voltage source 12 shown in FIG. 1. The constant voltage source 12a applies a constant voltage VBG generated by a band-gap reference circuit or the like to the positive input terminal (+) of an operational amplifier 69. The output terminal of the operational amplifier 69 is connected to the gate of an MOS-FET 37 of N-channel. The source of the MOS-FET 37 is connected to a circuit ground Gr via a resistor 47 and also connected to the negative input terminal (−) of the operational amplifier 69. The drain of the MOS-FET 37 is connected to the output 11a of the bias circuit 11 via a resistor 48. With this configuration, the MOS-FET 37 becomes a constant current source, and the constant voltage 12d is obtained across the resistor 48. Even if the values of the resistors 47 and 48 have significant variations, if the relative error therebetween is small, the voltage across the resistor 48 is stable. When the power source voltage Vdd of the power source VDD changes, the output voltage of the bias circuit 11 varies proportionately. However, since the voltage across the resistor 48 is constant, the operation of the constant voltage source 12a is similar to that of the floating constant voltage source 12 shown in FIG. 1, FIG. 2, FIG. 4 and FIG. 7. The ON resistances of the MOS-FETs 33 and 35 to which the constant voltage 12d of the constant voltage source 12a is applied are maintained constant.

It is found that an amplifier circuit 20e shown in FIG. 8 is significantly similar to the amplifier circuit 20d shown in FIG. 7. The circuit configuration comprising the MOS-FETs 33 and 34 and an operational amplifier 66 shown in FIG. 8 is completely the same as the circuit configuration comprising the MOS-FETs 31 and 32 and the operational amplifier 64 shown in FIG. 7. Similarly, the circuit configuration comprising the MOS-FETs 35 and 36 and an operational amplifier 67 shown in FIG. 8 is also the same as the circuit configuration comprising the MOS-FETs 31 and 32 and the operational amplifier 64 shown in FIG. 7. The circuit comprising resistors 49 and 50 and an operational amplifier 68 shown in FIG. 8 form a subtraction circuit (subtracter) in the case when the MOS-FETs 34 and 36 serve as input resistors. Hence, the amplifier circuit 20e outputs a difference signal between a signal input to an input terminal 54 and a signal input to an input terminal 53 to an output terminal 55, thereby canceling common mode components. When it is assumed that the MOS-FETs 33 and 35 are devices having the same characteristics, that the MOS-FETs 34 and 36 are devices having the same characteristics and that the resistors 49 and 50 have the same values, the signal-voltage V(55) output to the output terminal 55 is represented by equation (27) by virtue of the operation of the subtraction circuit incorporating the operational amplifier.

$$V55 = (\beta 36/\beta 35) \cdot \{R45/(R44+R45)\} \cdot (Vdd/V12) \cdot R50 \cdot (Iin53 - Iin54) \quad (27)$$

In the equation (27), R50 is the resistance value of the resistor 50, and β35 and β36 are the mutual conductance values per unit gate voltage of the MOS-FETs 35 and 36, respectively. In the MOS-FETs 35 and 36, a relationship of β∝(W/L) is established, as explained according to the equation (18) in the descriptions of the above-mentioned third embodiment. It is thus found that the output voltage V55 is proportional to the channel widths W, provided that the channel lengths L are the same. Since the power source voltage Vdd is included in the numerator of the equation (27), the output power source voltage V55 is proportional to the power source voltage Vdd.

The frequency characteristics of the power source voltage proportional amplifiers in accordance with the above-mentioned first to fourth embodiments are determined depending on the fundamental frequency characteristics of the MOS-FETs and operational amplifiers being used. In the case when MOS-FETs and operational amplifiers available at present are used, the maximum amplifiable frequency is about 10 MHz, for example. In other words, it is possible to amplify an input signal having a frequency of about 10 MHz. In addition, the frequency range in which the gain is proportional to the variation of the power source voltage is about 1 MHz, for example.

<<Fifth Embodiment>>

Figure 9:
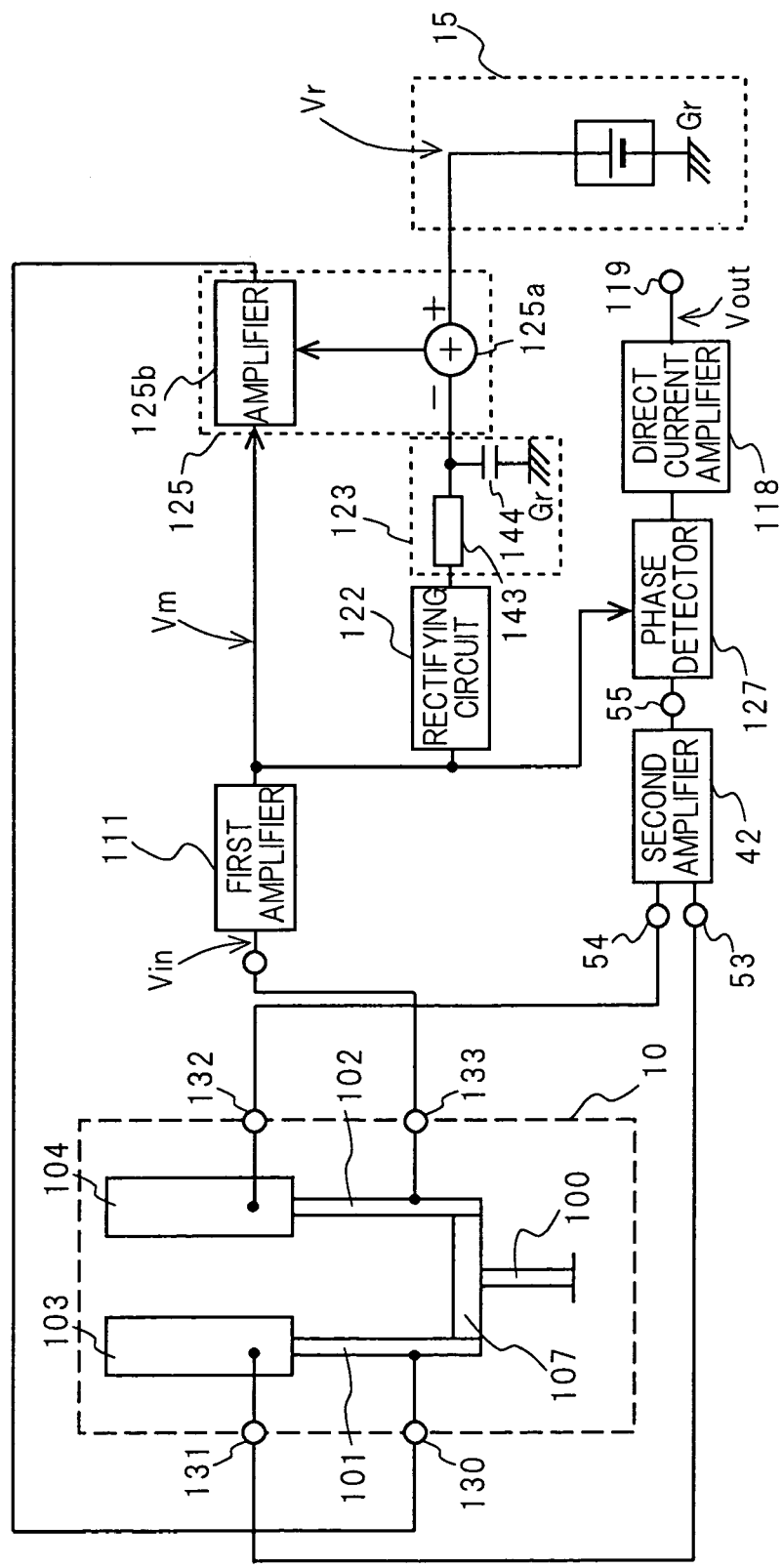
FIG. 9 is a system block diagram showing an angular velocity sensor apparatus in accordance with a fifth embodiment of the present invention comprising the power source voltage proportional amplifier in accordance with the fourth embodiment of the present invention and a tuning-fork vibration sensor.
Figure 12:
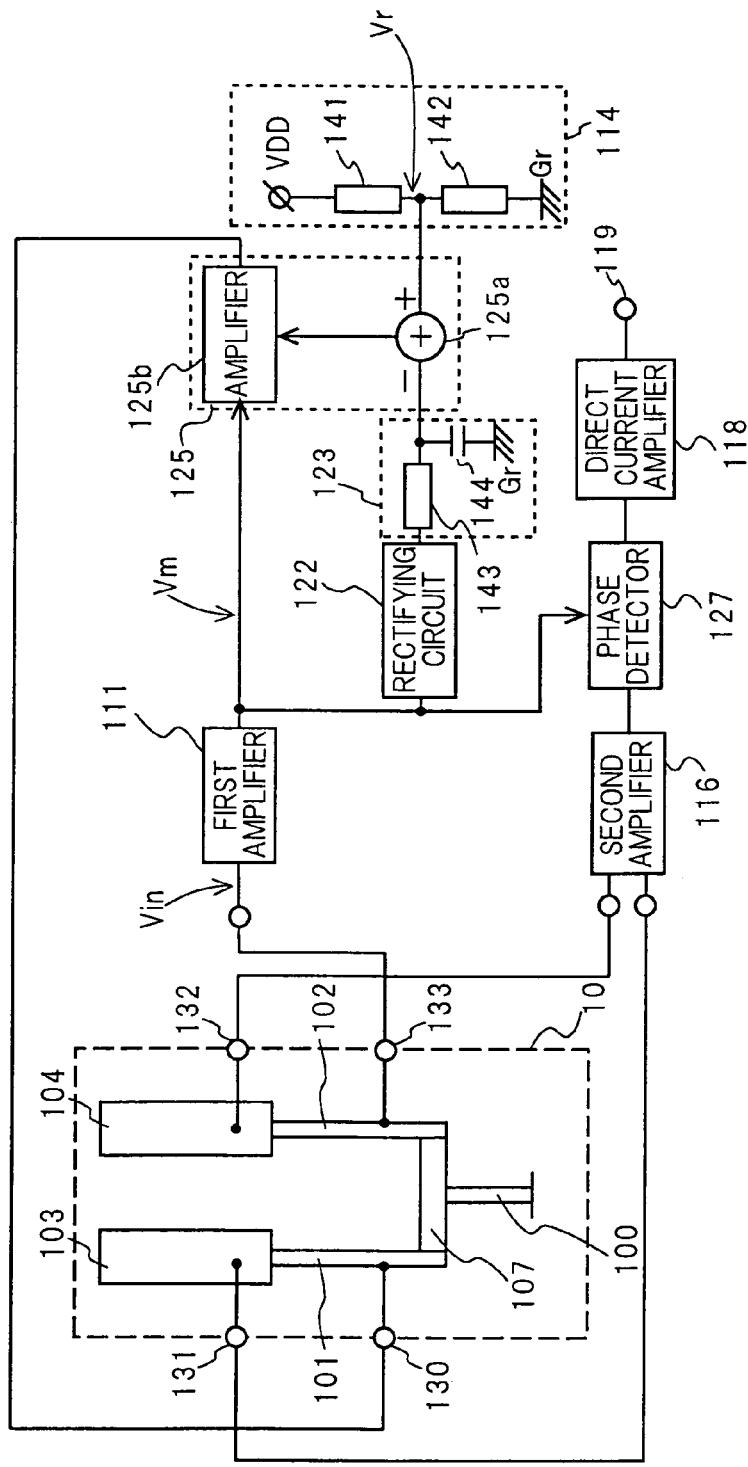
FIG. 12 is the system block diagram showing the conventional angular velocity sensor apparatus.

A fifth embodiment of the present invention relates to an angular velocity sensor apparatus incorporating the power source voltage proportional amplifier in accordance with the above-mentioned fourth embodiment. FIG. 9 is a block diagram of an angular velocity sensor apparatus having a circuit similar to that of the angular velocity sensor apparatus explained in the descriptions of the conventional technology referring to FIG. 12. The configuration shown in FIG. 9 differs from that shown in FIG. 12 in that a comparison voltage generation circuit 15 and a second amplifier 42 are incorporated. In the other sections, the configuration shown in FIG. 9 is identical to that shown in FIG. 12. The configuration of the angular velocity sensor apparatus shown in FIG. 9 will be described below briefly. An angular velocity sensor 10 has a tuning-fork structure wherein a vibration element is installed on each end of a connection plate 107 whose central portion is supported by a support post 100. A drive element 101 comprising the vibration element to which a piezoelectric element is bonded is installed at one end of the connection plate 107. The drive element 101 is the drive source for tuning-fork vibration. A detection element 103 for detecting a Coriolis force generated depending on an angular velocity is connected to the upper end of the drive element 101. A level detection element 102 comprising the vibration element to which a piezoelectric element is bonded is installed at the other end of the connection plate 107. The level detection element 102 is an element for detecting the vibration level, that is, amplitude, of the tuning-fork vibration. A detection element 104 for detecting a Coriolis force generated depending on an angular velocity is connected to the upper end of the level detection element 102.

A terminal 133 connected to the level detection element 102 of the angular velocity sensor 10 is connected to the input terminal of a first amplifier 111. An input signal Vin owing to the charge generated on the surface of the level detection element 102 is input to the first amplifier 111. The output voltage Vm of the first amplifier 111 is input to a rectifier 122, a variable gain amplifier 125 and a phase detector 127. The output voltage Vm is rectified by the rectifier 122, smoothened by a smoothing circuit 123 comprising a resistor 143 and a capacitor 144 and input to the negative input terminal of the adder 125a of the variable gain amplifier 125. The positive comparison voltage Vr of a comparison voltage generation circuit 15 is applied to the positive input terminal of the adder 125b. The comparison voltage generation circuit 15 a constant voltage source, such as a band-gap constant voltage source, whose negative terminal is connected to a circuit ground Gr. The adder 125a applies the voltage difference between the output voltage of the smoothing circuit 123 and the comparison voltage Vr to an amplifier 125b that is capable of changing its gain by virtue of voltage control in the variable gain amplifier 125. The gain of the amplifier 125b is controlled by the voltage difference between the two voltages input to the adder 125a. An output signal obtained by this control is applied from the drive terminal 130 of the angular velocity sensor 10 to the drive element 101 and drives this element.

Since the output of the first amplifier 111 is amplified by the variable gain amplifier 125 and applied from the terminal 130 of the angular velocity sensor 10 to the drive element 101, the loop circuit circuit including the first amplifier 111, the rectifier 122, the smoothing circuit 123, the variable gain amplifier 125 and the angular velocity sensor 10 forms a sinusoidal oscillation circuit having an automatic gain control function. This loop circuit is hereafter referred to as an "AGC loop circuit." The amplitude of the output voltage Vm of the first amplifier 111 is controlled so as to become constant by the AGC loop circuit. Since the voltage of the comparison voltage generation circuit 15 is fixed, the AGC loop circuit operates on a constant voltage regardless of the variation of the power source voltage Vdd. Hence, the amounts of the charges output from the detection-use piezoelectric elements 103 and 104 are not affected by the power source voltage Vdd either. The phase detector 127 and the DC amplifier 118 following the second amplifier 42 having an amplification degree proportional to the power source voltage Vdd do not depend on the power source voltage. However, the signal output to an angular velocity signal output terminal 119, that is, the output of the angular velocity sensor apparatus, depends on the power source voltage since the second amplifier serving as a power source voltage proportional amplifier depends on the power source voltage.

In FIG. 9, the second amplifier 42 is a power source voltage proportional amplifier 42 in accordance with the above-mentioned fourth embodiment shown in FIG. 8. The two input terminals 53 and 54 of the power source voltage proportional amplifier 42 are connected to the output terminals 131 and 132 of the detection elements 103 and 04, respectively. The output terminal 55 of the power source voltage proportional amplifier 42 is connected to the second input terminal of the phase detector 127.

The output detected by the phase detector 127 is DC amplified by the DC amplifier 118 and output from the output terminal 119 as an output signal having a level proportional to the power source voltage Vdd and indicating an angular velocity.

Figure 10:
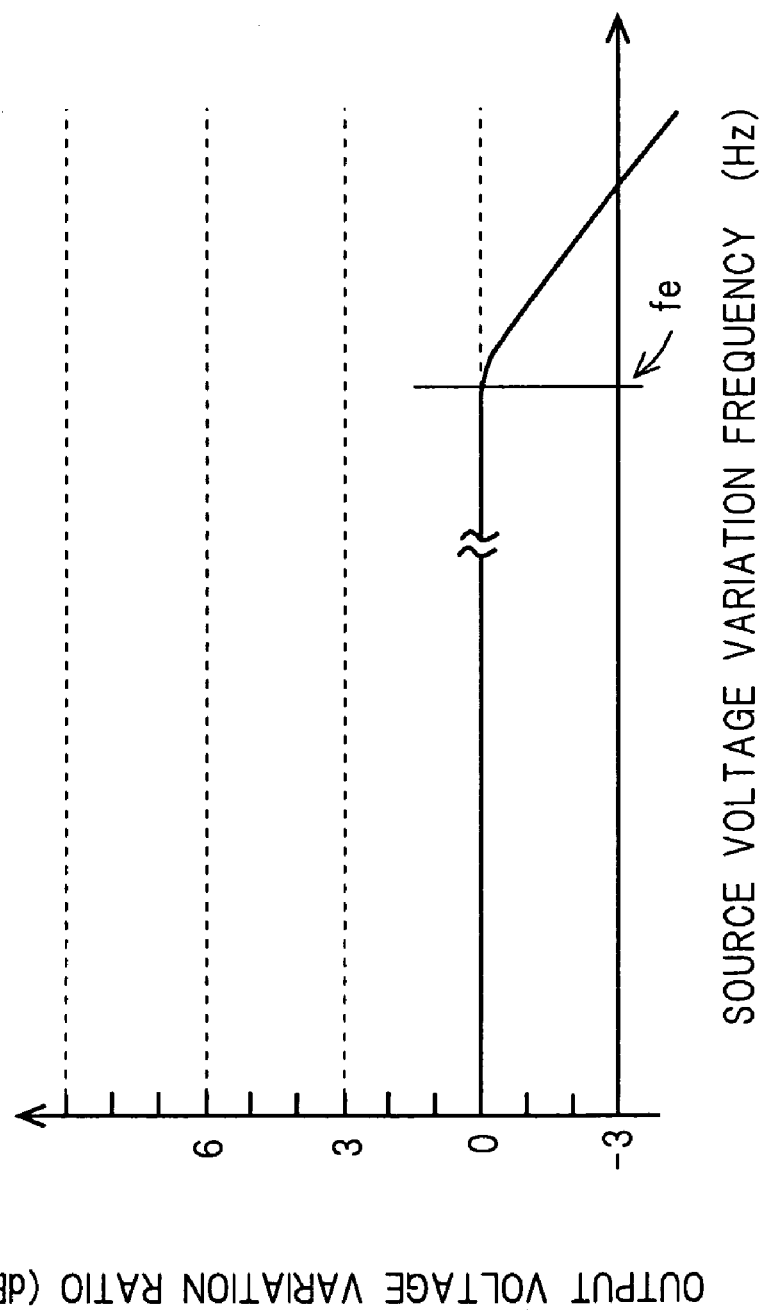
FIG. 10 is a graph showing the relationship between the output voltage variation ratio and the variation frequency of a power source voltage at the time when the power source voltage varies in the angular velocity sensor apparatus shown in FIG. 9 in accordance with the present invention.
Figure 13:
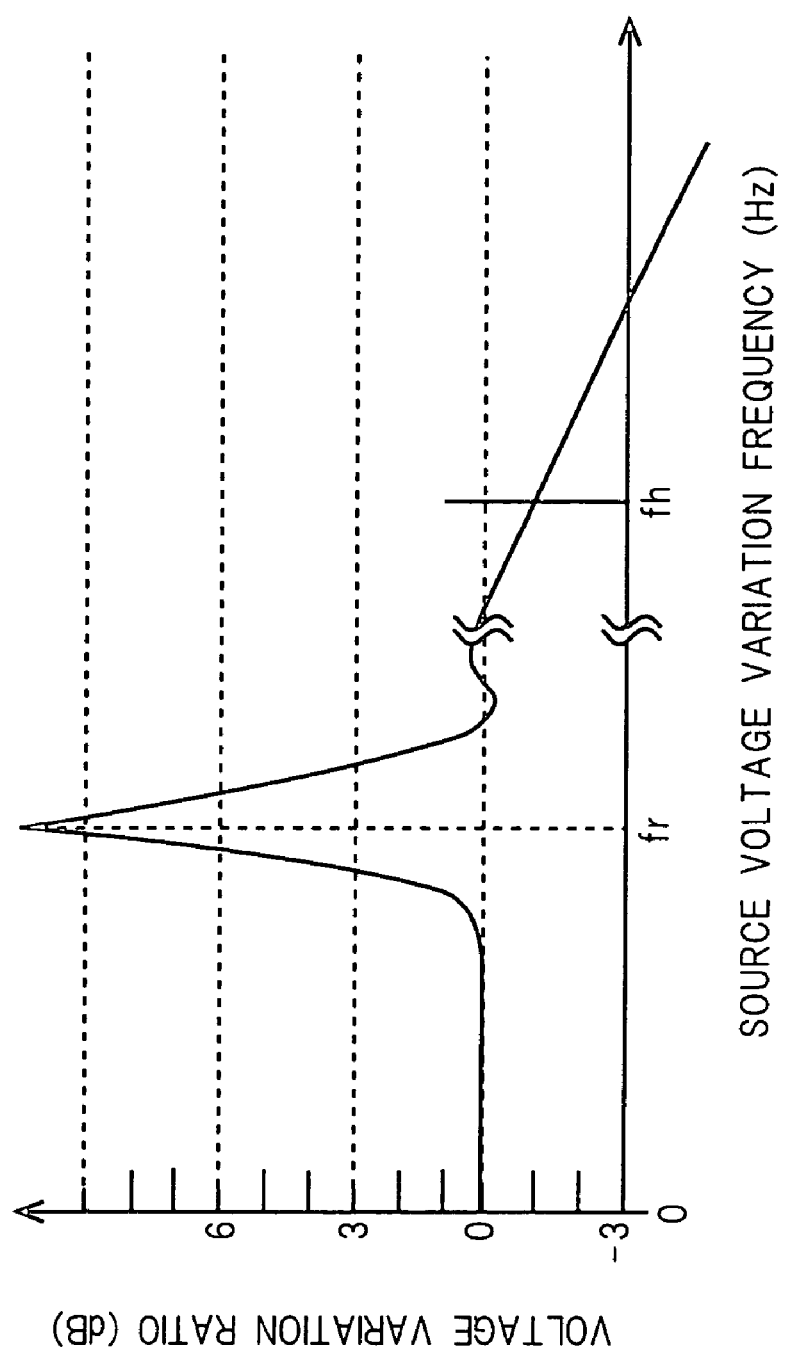
FIG. 13 is the graph showing the change of the voltage variation ratio (dB) at the time when the power source voltage varies in the conventional angular velocity sensor apparatus shown in FIG. 12.

The power source voltage response characteristics of the angular velocity sensor apparatus shown in FIG. 9 will be described referring to FIG. 10 and FIG. 11. FIG. 10 shows the relationship between the variation of the power source voltage and the output voltage variation ratio at the time when the power source voltage Vdd is varied to have a sinusoidal waveform and its frequency is changed, while a constant angular velocity is given. The output voltage variation ratio (dB) of the output voltage Vout of the output terminal 119 is represented by the ratio of the output voltage variation rate RVout of the output voltage Vout and the power source voltage variation rate RVdd of the power source voltage Vdd, that is, RVout/RVdd. For example, if the output voltage Vout rises 10% when the power source voltage Vdd rises 10%, the output voltage variation ratio RVout/RVdd is 0 dB. In the angular velocity sensor apparatus in accordance with this embodiment, when the variation frequency of the power source voltage Vdd is fe or less, the output voltage Vout varies in proportion to the power source voltage Vdd. Hence, the power source voltage variation rate RVdd and the output voltage variation rate RVout have the same value, whereby the output voltage variation ratio becomes 0 dB. In the case when the power source voltage Vdd varies fast at the frequency fe or higher, the output voltage variation rate RVout becomes smaller than the power source voltage variation rate RVdd. Hence, the voltage variation ratio becomes smaller than 0 dB as shown in the graph of FIG. 10. The frequency fe is 1 to 2 kHz, more than 10 times as high as that of the conventional angular velocity sensor shown in FIG. 12. As described above, in the angular velocity sensor apparatus in accordance with the present invention, even in the case when the power source voltage Vdd varies at a variation frequency of about 2 kHz, an amplification characteristic wherein the gain is proportional to the power source voltage is obtained, whereby it is possible to obtain an accurate angular velocity detection value. The peak at the resonance frequency fr shown in FIG. 13 in the conventional angular velocity sensor apparatus does not appear in the angular velocity sensor apparatus in accordance with the present invention. The attenuation at a high frequency of 2 kHz or more is caused by the characteristic of a filter circuit incorporated in the phase detector 127.

FIG. 11a shows a state wherein the power source voltage Vdd is increased unit step by A % while a constant angular velocity is detected. FIG. 11b shows that the output voltage Vm in the AGC loop circuit does not vary even when the power source voltage Vdd is increased. FIG. 11c shows the variation of the output voltage Vout indicating the angular velocity. Although a delay in rising occurs owing to the influence of the filter circuit of the phase detector 127, ringing and the like do not occur as explained referring to FIG. 10.

Although the present invention has been described with respect to its preferred embodiments, the present invention is not limited to these embodiments. It will be understood that various modifications may be made without departing from the technical scope of the present invention. Further, the scope of the application of an amplifier with a gain proportional to source voltage according to the present invention is not limited to angular velocity sensors having the above-mentioned tuning fork structure, but includes velocity sensors having the other structures and other various electronic apparatus.

What is claimed is:

1. An amplifier with a gain proportional to power source voltage comprising:
   first and second P-channel MOS field-effect transistors (hereafter abbreviated to MOS-FETs) formed such that respective back gates are electrically isolated from a semiconductor substrate and respective sources are connected in common,
   a first voltage source for outputting a voltage obtained by dividing a power source voltage,
   a second voltage source for generating a positive voltage having a potential difference almost identical to the threshold voltages of said first and second MOS-FETs with reference to the output voltage of said first voltage source,
   a third voltage source for generating a predetermined negative voltage with reference to the output voltage of said first voltage source, and
   an operational amplifier, to the positive input terminal of which the output of said second voltage source is applied as a bias voltage, wherein
   the sources of said first and second MOS-FETs, connected in common, are connected to the negative input terminal of said operational amplifier,
   the respective back gates of said first and second MOS-FETs are connected to either their respective sources or said second voltage source,
   the gate of said first MOS-FET is biased at the potential of a circuit ground, and its drain is connected to an input terminal to which a signal with no DC component is input, and
   the gate of said second MOS-FET is connected to said third voltage source, and its drain is connected to the output terminal of said operational amplifier.

2. An amplifier with a gain proportional to power source voltage comprising:
   first and second N-channel MOS-FETs formed such that respective back gates are electrically isolated from a semiconductor substrate and respective sources are connected in common,
   a first voltage source for outputting a voltage obtained by dividing a power source voltage,
   a second voltage source for generating a negative voltage having a potential difference almost identical to the threshold voltages of said first and second MOS-FETs with reference to the output voltage of said first voltage source,
   a third voltage source for generating a predetermined positive voltage with reference to the output voltage of said first voltage source, and an operational amplifier, to the positive input terminal of which the output of said second voltage source is applied as a bias voltage, wherein the sources of said first and second MOS-FETs, connected in common, are connected to the negative input terminal of said operational amplifier, the respective back gates of said first and second MOS-FETs are connected to either their respective sources or the output terminal of said second voltage source, the gate of said first MOS-FET is connected to said positive power source voltage, and its drain is connected to an input terminal to which a signal with no DC component is input, and the gate of said second MOS-FET is connected to said third voltage source, and its drain is connected to the output terminal of said operational amplifier.

3. An amplifier with a gain proportional to power source voltage comprising:

first and second P-channel MOS-FETs formed such that respective back gates are electrically isolated from a semiconductor substrate and respective sources are connected in common, a first voltage source for outputting a voltage obtained by dividing a power source voltage, a second voltage source for generating, at its output terminal, a positive voltage having a potential difference almost identical to the threshold voltages of said first and second MOS-FETs with reference to the output voltage of said first voltage source, a third voltage source for generating a predetermined negative voltage with reference to the output voltage of said first voltage source, and first and second operational amplifiers connected to the output terminal of said second voltage source at respective positive input terminals, wherein the sources of said first and second MOS-FETs connected in common, are connected to the output terminal of said first operational amplifier, the respective back gates of said first and second MOS-FETs are connected to either their respective sources or said second voltage source, the gate of said first MOS-FET is connected to said third voltage source, and its drain is connected to the negative input terminal of said first operational amplifier and to an input terminal to which a signal with no DC component is input, the gate of said second MOS-FET is connected to a circuit ground, and its drain is connected to the negative input terminal of said second operational amplifier, and a resistor is connected across the negative input terminal of said second operational amplifier and the output terminal of said second operational amplifier coupled to the output terminal of said operational amplifier.

4. An amplifier with a gain proportional to power source voltage comprising:

first and second P-channel MOS-FETs formed such that respective back gates are electrically isolated from a semiconductor substrate and respective sources are connected in common, third and fourth P-channel MOS-FETs formed so that respective back gates are electrically isolated from a semiconductor substrate and respective sources are connected in common, a first voltage source for outputting a voltage obtained by dividing a power source voltage, a second voltage source for generating, at its output terminal, a positive voltage having a potential difference almost identical to the threshold voltages of said first, second, third and fourth MOS-FETs with reference to the output voltage of said first voltage source, a third voltage source for generating a predetermined negative voltage with reference to the output voltage of said first voltage source, first and second operational amplifiers which are connected in common at respective positive input terminals and biased by said second voltage source, said first and second P-channel MOS-FETs which are connected in common at respective sources connected to the output terminal of said first operational amplifier, and said third and fourth P-channel MOS-FETs which are connected in common at respective sources connected to the output terminal of said second operational amplifier, wherein the respective back gates of said first, second, third and fourth MOS-FETs are connected to either their respective sources or said second voltage source, the gates of said first and third MOS-FETs are connected to said third voltage source, the drain of said first MOS-FET is connected to the negative input terminal of said first operational amplifier and to a first input terminal to which a signal with no DC component is input, the drain of said third MOS-FET is connected to the negative input terminal of said second operational amplifier and to a second input terminal to which a signal with no DC component is input, the gates of said second and fourth MOS-FETs are connected to a circuit ground, the drain of said second MOS-FET is connected to the positive input terminal of said third operational amplifier, the drain of said fourth MOS-FET is connected to the negative input terminal of said third operational amplifier, said second voltage source is connected to the positive input terminal of said third operational amplifier via a first resistor, and a second resistor is connected across the negative input terminal of said third operational amplifier and the output terminal of said third operational amplifier coupled to the output terminal of said amplifier.

5. An angular velocity sensor apparatus comprising:

a drive section for vibrating vibration elements, a vibration level detection section for detecting the vibration levels of said vibration elements, Coriolis force detection sections for detecting a Coriolis force generating depending on an angular velocity, a first amplifier for amplifying the output signal of said vibration level detection section, a rectifying circuit for rectifying the output signal of said first amplifier to obtain a DC voltage, a variable gain amplifier, receiving the output signal of said first amplifier, for changing its gain depending on the output value of said rectifying circuit, a second amplifier for amplifying the output signals of said Coriolis force detection sections, a phase detector for detecting the phase of the output voltage of said second amplifier on the basis of the vibration frequencies of said vibration elements, and a DC amplifier for DC amplifying the output of said phase detector, wherein said second amplifier comprises:

at least two operational amplifiers, and at least two MOS-FETs in which the drain-source voltage is biased at 0 V, wherein one of said MOS-FETs is biased so that the gate-source voltage becomes constant, and the other MOS-FET is biased so that the gate-source voltage changes depending on the variation of a power source voltage, and the gains of said operational amplifiers are determined by the ratio of the channel resistances of said at least two MOS-FETs biased by said voltages different from each other.

6. An angular velocity sensor apparatus comprising:

a drive section for vibrating vibration elements, a vibration level detection section for detecting the vibration levels of said vibration elements, Coriolis force detection sections for detecting a Coriolis force generating depending on an angular velocity, a first amplifier for amplifying the output signal of said vibration level detection section, a rectifying circuit for rectifying the output signal of said first amplifier to obtain a DC voltage, a variable gain amplifier, receiving the output signal of said first amplifier, for changing its amplification degree depending on the output value of said rectifying circuit, a second amplifier for amplifying the output signals of said Coriolis force detection sections, a phase detector for detecting the phase of the output voltage of said second amplifier on the basis of the vibration frequencies of said vibration elements, and a DC amplifier for DC amplifying the output of said phase detector, wherein said second amplifier comprises:

first and second P-channel MOS-FETs formed so that respective back gates are electrically isolated from a semiconductor substrate and respective sources are connected in common, third and fourth P-channel MOS-FETs so that respective back gates are electrically isolated from a semiconductor substrate and respective sources are connected in common, a first voltage source for outputting a voltage obtained by dividing a power source voltage, a second voltage source for generating, at its output terminal, a positive voltage having a potential difference almost identical to the threshold voltages of said first, second, third and fourth MOS-FETs with reference to the output voltage of said first voltage source, a third voltage source for generating a predetermined negative voltage with reference to the output voltage of said first voltage source, first and second operational amplifiers which are connected in common at respective positive input terminals and biased by said second voltage source, said first and second P-channel MOS-FETs which are connected in common at respective sources connected to the output terminal of said first operational amplifier, said third and fourth P-channel MOS-FETs which are connected in common at respective sources connected to the output terminal of said second operational amplifier, the respective back gates of said first, second, third and fourth MOS-FETs are connected to either their respective sources or said second voltage source, the gates of said first and third MOS-FETs are connected to said third voltage source, the drain of said first MOS-FET is connected to the negative input terminal of said first operational amplifier and to a first input terminal to which a signal with no DC component is input, the drain of said third MOS-FET is connected to the negative input terminal of said second operational amplifier and to a second input terminal to which a signal with no DC component is input, the gates of said second and fourth MOS-FETs are connected to a circuit ground, the drain of said second MOS-FET is connected to the positive input terminal of said third operational amplifier, the drain of said fourth MOS-FET is connected to the negative input terminal of said third operational amplifier, said second voltage source is connected to the positive input terminal of said third operational amplifier via a first resistor, and a second resistor is connected across the negative input terminal of said third operational amplifier and the output terminal of said third operational amplifier, which leads to the output terminal of said amplifier.

* * * * *